(12) United States Patent
Nguyen et al.

(10) Patent No.: US 12,314,842 B2
(45) Date of Patent: May 27, 2025

(54) MATRIX-VECTOR MULTIPLICATION USING SOT-BASED NON-VOLATILE MEMORY CELLS

(71) Applicant: Western Digital Technologies, Inc., San Jose, CA (US)

(72) Inventors: Thao A. Nguyen, San Jose, CA (US); Michael Ho, Redwood City, CA (US); Zhigang Bai, Fremont, CA (US); Xiaoyong Liu, San Jose, CA (US); Zhanjie Li, Pleasanton, CA (US); Yongchul Ahn, San Jose, CA (US); Hongquan Jiang, San Jose, CA (US); Quang Le, San Jose, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 1057 days.

(21) Appl. No.: 17/172,155

(22) Filed: Feb. 10, 2021

(65) Prior Publication Data
US 2022/0044103 A1 Feb. 10, 2022

Related U.S. Application Data

(60) Provisional application No. 63/063,618, filed on Aug. 10, 2020.

(51) Int. Cl.
*G11C 11/16* (2006.01)
*G06F 17/16* (2006.01)
(Continued)

(52) U.S. Cl.
CPC ............. *G06N 3/063* (2013.01); *G06F 17/16* (2013.01); *G06N 3/08* (2013.01); *G11C 11/161* (2013.01);
(Continued)

(58) Field of Classification Search
CPC .......... G06N 3/063; G06N 3/08; G06F 17/16; G11C 11/161; G11C 11/1675;
(Continued)

(56) References Cited

U.S. PATENT DOCUMENTS 10,340,901 B2 7/2019 Yoshinari et al.
10,528,643 B1 * 1/2020 Choi ....................... G06F 17/16
(Continued)

FOREIGN PATENT DOCUMENTS

JP 6620915 12/2019

OTHER PUBLICATIONS

Response to Office Action dated Apr. 26, 2022 in U.S. Appl. No. 17/172,175.
(Continued)

*Primary Examiner* — Michael T Tran
(74) *Attorney, Agent, or Firm* — Patent Law Works LLP

(57) ABSTRACT

An apparatus is provided that includes an array including n rows and m columns of nodes, each row of nodes coupled to one of n first conductive lines, each column of nodes coupled to one of m second conductive lines, each node of the n rows and m columns of nodes including a spin orbit torque MRAM non-volatile memory cell configured to store a corresponding weight of an n×m array of weights each having a first weight value or a second weight value, and a control circuit configured to apply n input voltages each having a first input value or a second input value to corresponding n first conductive lines, the n input voltages corresponding to an n-element input vector. The spin orbit torque MRAM non-volatile memory cells are configured to generate m output currents at the m second conductive lines upon application of the n input voltages. The m output currents corresponding to a result of multiplying the input vector by the n×m array of weights.

20 Claims, 12 Drawing Sheets

(51) Int. Cl.
  *G06N 3/063* (2023.01)
  *G06N 3/08* (2023.01)
  *G11C 11/18* (2006.01)
  *H10B 61/00* (2023.01)
  *H10N 50/85* (2023.01)
  *H10N 52/00* (2023.01)
  *H10N 52/80* (2023.01)

(52) U.S. Cl.
  CPC .......... *G11C 11/1675* (2013.01); *G11C 11/18* (2013.01); *H10B 61/00* (2023.02); *H10N 50/85* (2023.02); *H10N 52/00* (2023.02); *H10N 52/80* (2023.02)

(58) Field of Classification Search
  CPC ........ G11C 11/18; H10B 61/00; H10B 61/22; H10N 50/85; H10N 52/00; H10N 52/80; H10N 50/10
  USPC .................................................. 365/129, 158
  See application file for complete search history.

(56) References Cited

U.S. PATENT DOCUMENTS

| | | | |
|---|---|---|---|
| 10,832,710 B1 | 11/2020 | Song et al. | |
| 11,170,852 B1* | 11/2021 | Kinney | G11C 11/1675 |
| 11,177,432 B2 | 11/2021 | Chen et al. | |
| 2007/0077454 A1 | 4/2007 | Sakamoto et al. | |
| 2014/0056061 A1 | 2/2014 | Khvalkovskiy et al. | |
| 2014/0176184 A1 | 6/2014 | Johnson | |
| 2014/0269035 A1 | 9/2014 | Manipatruni et al. | |
| 2015/0213868 A1 | 7/2015 | Wu et al. | |
| 2016/0300999 A1 | 10/2016 | Yi et al. | |
| 2016/0372656 A1 | 12/2016 | Pinarbasi et al. | |
| 2017/0178705 A1 | 6/2017 | Buhrman et al. | |
| 2017/0330070 A1 | 11/2017 | Sengupta et al. | |
| 2018/0033954 A1 | 2/2018 | Aradhya et al. | |
| 2018/0061467 A1 | 3/2018 | Kan et al. | |
| 2019/0131977 A1 | 5/2019 | Obradovic et al. | |
| 2019/0265074 A1 | 8/2019 | Gaydov et al. | |
| 2019/0272870 A1 | 9/2019 | Choi et al. | |
| 2020/0012924 A1 | 1/2020 | Ma et al. | |
| 2020/0034686 A1 | 1/2020 | Chiu et al. | |
| 2020/0034697 A1* | 1/2020 | Choi | G11C 11/1673 |
| 2020/0035305 A1* | 1/2020 | Choi | G11C 11/54 |
| 2020/0035910 A1 | 1/2020 | Li et al. | |
| 2020/0058847 A1 | 2/2020 | Lee et al. | |
| 2020/0075099 A1* | 3/2020 | Choi | G11C 11/1659 |
| 2020/0168790 A1 | 5/2020 | Oikawa et al. | |
| 2020/0265892 A1* | 8/2020 | Hatcher | G11C 13/003 |
| 2020/0279850 A1* | 9/2020 | Sharma | H01L 27/1207 |
| 2020/0310818 A1* | 10/2020 | Ware | G06F 9/3869 |
| 2020/0312908 A1 | 10/2020 | Oguz et al. | |
| 2020/0410334 A1* | 12/2020 | Choi | G06N 3/04 |
| 2021/0064379 A1 | 3/2021 | Mattina et al. | |
| 2021/0110244 A1* | 4/2021 | Hoang | G06F 17/16 |
| 2021/0202827 A1 | 7/2021 | Song et al. | |
| 2021/0303976 A1* | 9/2021 | Gunnam | G06N 3/08 |
| 2021/0326112 A1* | 10/2021 | Chakraborty | G06N 3/065 |
| 2021/0397931 A1* | 12/2021 | Hoang | G06N 3/048 |
| 2021/0406672 A1* | 12/2021 | Hoang | G06F 12/0238 |
| 2022/0019881 A1* | 1/2022 | Lin | G11C 29/76 |
| 2022/0076737 A1* | 3/2022 | Cosemans | G06J 1/00 |
| 2022/0263582 A1* | 8/2022 | Ma | H04B 10/614 |
| 2022/0383921 A1* | 12/2022 | Rizzolo | H10N 50/80 |

OTHER PUBLICATIONS

Office Action dated Feb. 7, 2022 in U.S. Appl. No. 17/172,175.
Notice of Allowance and Fee(s) Due dated Jan. 10, 2022 in U.S. Appl. No. 17/172,190.
Fan et al., "Energy Efficient In-Memory Binary Deep Neural Network Accelerator with Dual-Mode SOT-MRAM", 2017 EEE International Conference on Computer Design (ICCD), Nov. 5-8, 2017 https://ieeexplore.ieee.org/document/8119280.
Ohno et al., "Spin-orbit Torque Devices for Digital and Neuromorphic Computing", Sep. 28, 2017 http://csrn-osaka.sakura.ne.jp/kanamori-memorial/abstract-session-Spintronics/S4-Ohno.pdf.
Milo et al., "Memristive and CMOS Devices for Neuromorphic Computing", Dipartimento di Elletronica, Informazione e Biongengneria, Politecnico di Milano and Italian Universities Nanoelectronics Team (IU.NET), Jan. 1, 2020 https://www.mdpi.com/1996-1944/13/1/166/htm.
Torrejon et al., "Neuromorphic computing with nanoscale spintronic oscillators", nature.com, Jul. 27, 2017, https://arxiv.org/ftp/arxiv/papers/1701/1701.07715.pdf.
Andrew Myers, "Small, fast, energy-efficient memory to spur new computer applications", engineering.stanford.edu, Nov. 6, 2018, https://engineering.stanford.edu/magazine/article/small-fast-energy-efficient-memory-spur-new-computer-applications.
Deliang Fan et al., "Injection-Locked Spin Hall-Induced Coupled-Oscillators for Energy Efficient Associative Computing", IEEE Transactions on Nanotechnology, vol. 14, No. 6, Nov. 2015.
U.S. Appl. No. 17/172,175, filed Feb. 10, 2021.
U.S. Appl. No. 17/172,190, filed Feb. 10, 2021.

* cited by examiner

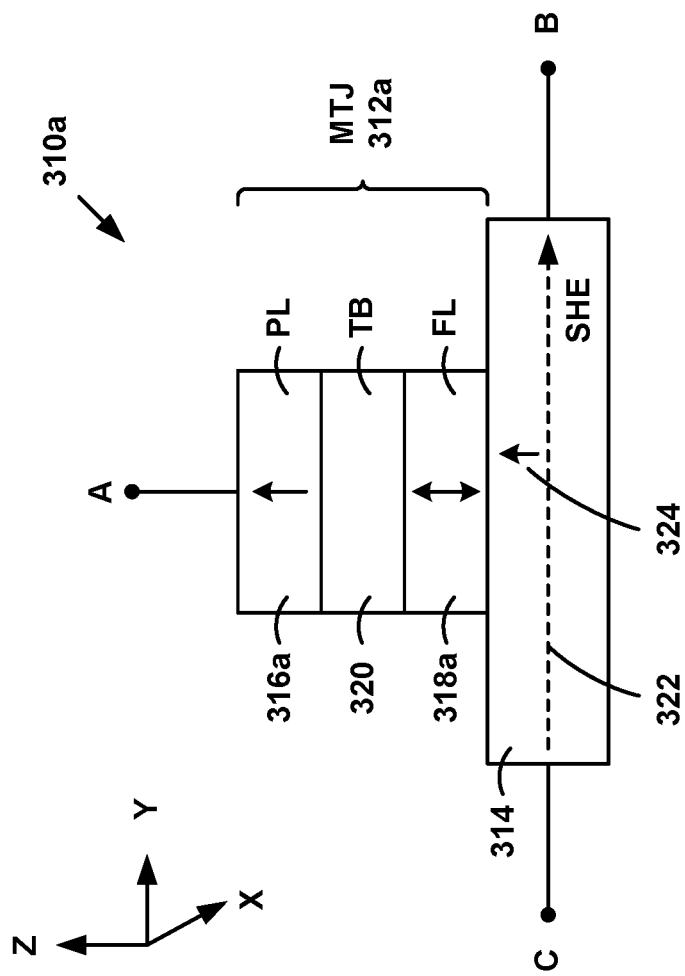
FIG. 3B1

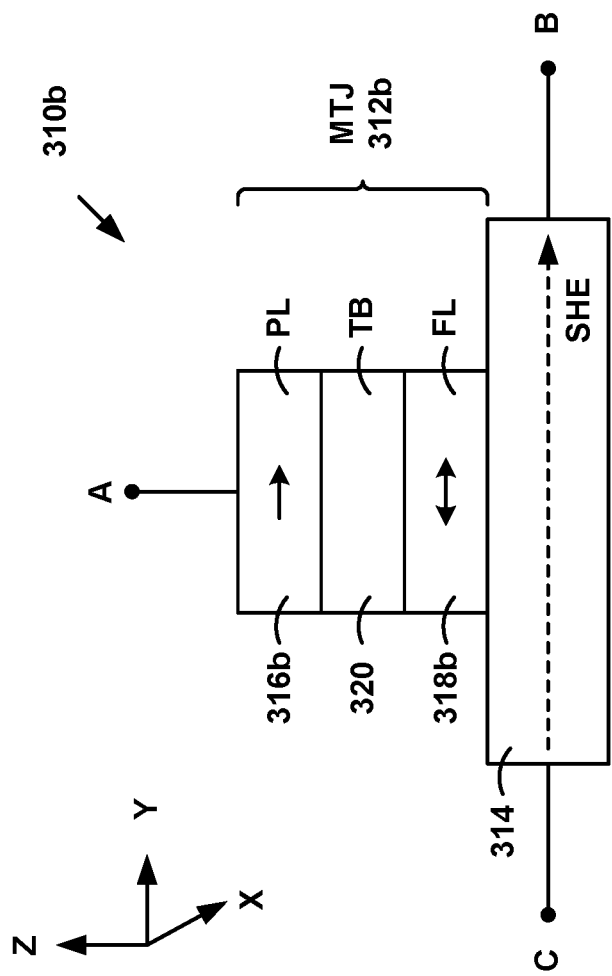
FIG. 3B2

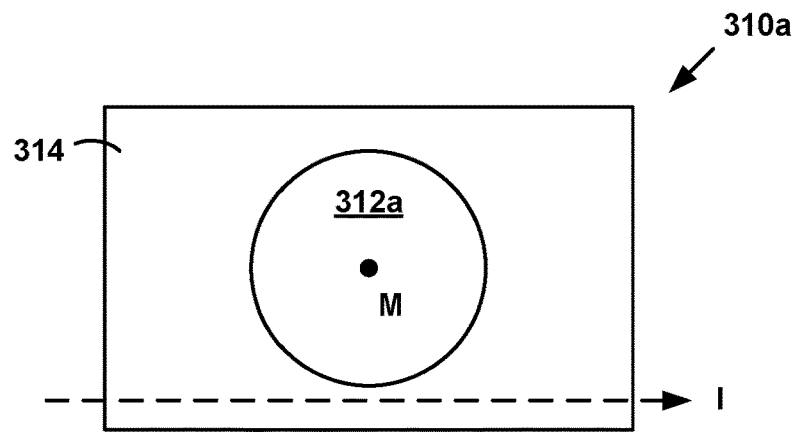
FIG. 3C
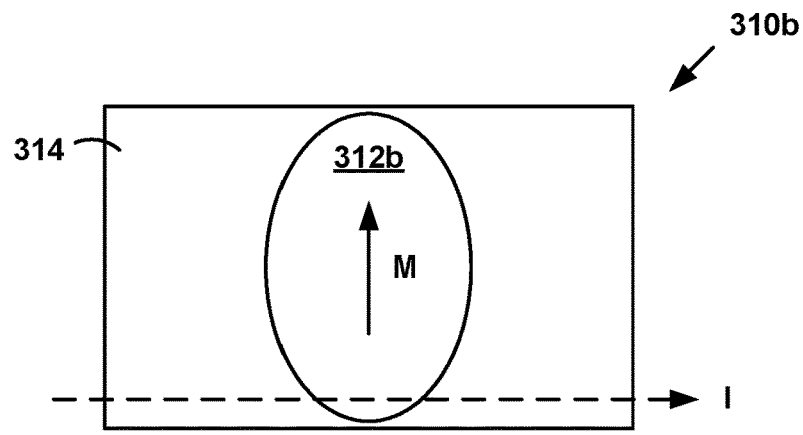
FIG. 3D1
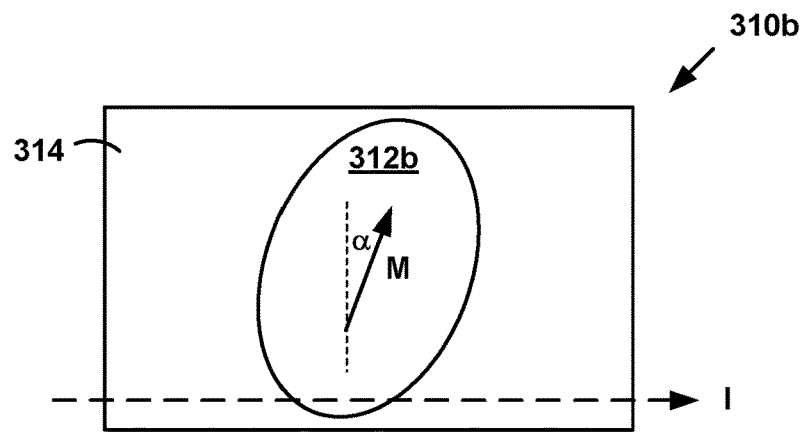
FIG. 3D2

MATRIX-VECTOR MULTIPLICATION USING SOT-BASED NON-VOLATILE MEMORY CELLS

CLAIM OF PRIORITY

The present application claims priority from U.S. Provisional Patent Application No. 63/063,618, entitled "MATRIX-VECTOR MULTIPLICATION USING SOT-BASED NON-VOLATILE MEMORY CELLS," filed Aug. 10, 2020, incorporated by reference herein in its entirety.

BACKGROUND

Semiconductor memory is widely used in various electronic devices such as mobile computing devices, mobile phones, solid-state drives, digital cameras, personal digital assistants, medical electronics, servers, and non-mobile computing devices. Semiconductor memory may include non-volatile memory or volatile memory. A non-volatile memory device allows information to be stored or retained even when the non-volatile memory device is not connected to a source of power (e.g., a battery).

Examples of non-volatile memory include, but are not limited to, magnetoresistive memory (e.g., MRAM), phase change memory (e.g., PCM) ferroelectric field effect transistor (FeFET) memory, ferroelectric memory (e.g., FeRAM), and flash memory (e.g., NAND-type and NOR-type flash memory).

BRIEF DESCRIPTION OF THE DRAWINGS

FIG. 3B1 depicts an example SOT MRAM non-volatile memory cell of the apparatus of FIG. 3A.

FIG. 3B2 depicts another example SOT MRAM non-volatile memory cell of the apparatus of FIG. 3A.

FIG. 3C depicts an embodiment of a magnetic tunnel junction of the SOT MRAM non-volatile memory cell of the apparatus of FIG. 3B1.

FIG. 3D1 depicts an embodiment of a magnetic tunnel junction of the SOT MRAM non-volatile memory cell of the apparatus of FIG. 3B2.

FIG. 3D2 depicts another embodiment of a magnetic tunnel junction of the SOT MRAM non-volatile memory cell of the apparatus of FIG. 3B2.

DETAILED DESCRIPTION

Figure 1A:
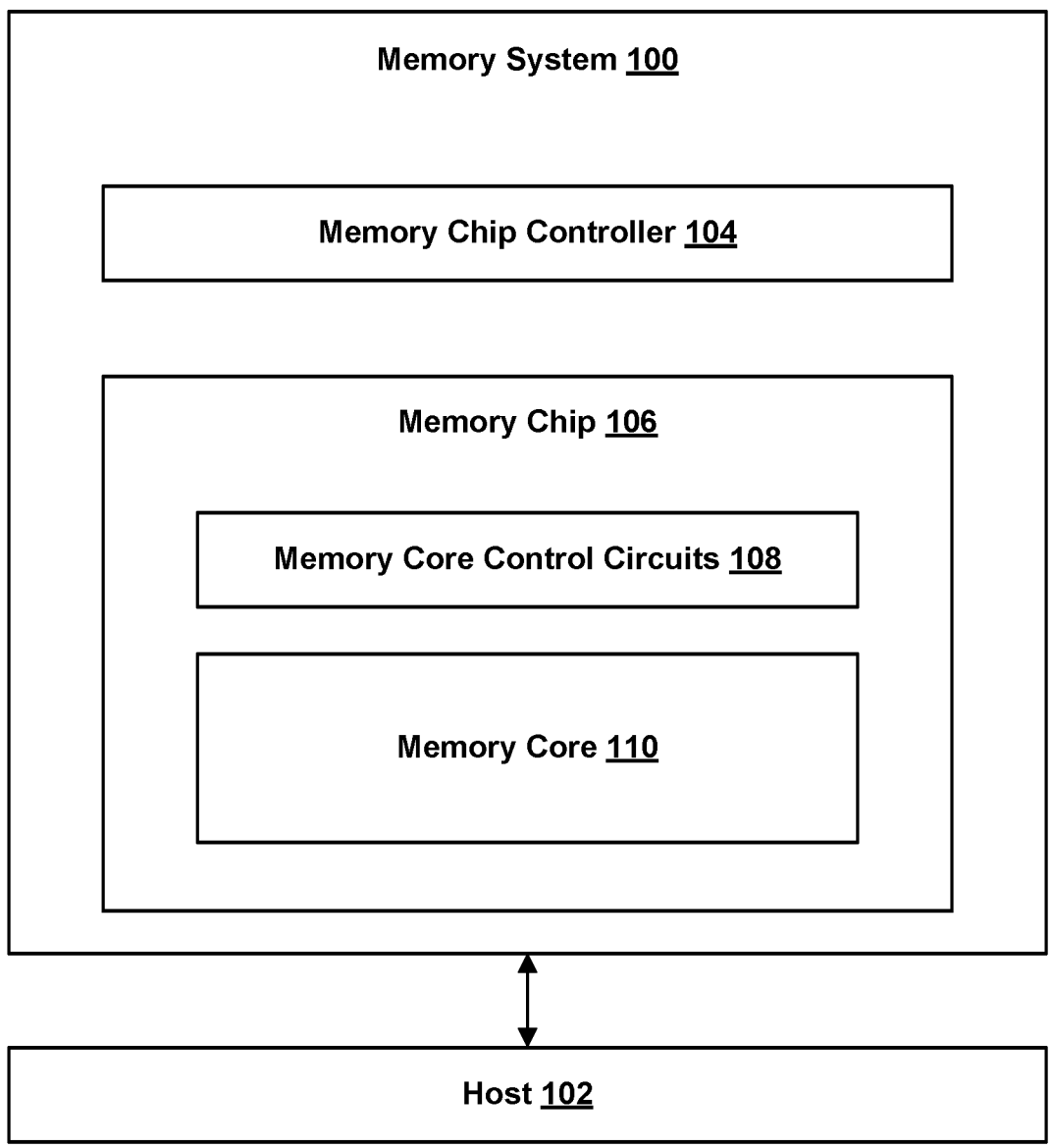
FIG. 1A depicts an embodiment of a memory system and a host.

Technology is described for using non-volatile memory cells to perform multiplication. In particular, technology is described for using spin orbit torque (SOT) MRAM non-volatile memory cells to perform matrix-vector multiplication in a neuromorphic computing system. A neuromorphic computing system may be used to implement an artificial neural network.

Matrix-vector multiplication may be performed by taking the dot product of a vector with each column vector of a matrix. A vector dot product is the sum of products of the corresponding elements of two equal length vectors. Accordingly, a non-volatile memory system that performs matrix-vector multiplication also may be referred to as a multiplier-accumulator (MAC).

In an embodiment, a non-volatile memory system includes an array that includes n rows and m columns of nodes, with each node including a non-volatile memory cell. In this regard, the array is an n×m array of non-volatile memory cells. In an embodiment, each row of nodes is coupled to one of n first conductive lines (e.g., word lines), and each column of nodes is coupled to one of m second conductive lines (e.g., bit lines).

In an embodiment, each non-volatile memory cell includes an SOT MRAM non-volatile memory cell. Thus, in an embodiment each row of SOT MRAM non-volatile memory cells is coupled to one of n first conductive lines (e.g., word lines), and each column of SOT MRAM non-volatile memory cells is coupled to one of m second conductive lines (e.g., bit lines).

In an embodiment, each memory cell in the n×m array of SOT MRAM non-volatile memory cells is configured to store a corresponding weight of an n×m array of weights. In an embodiment, each weight is a single-bit binary weight, and has either a first weight value (e.g., "1") or a second weight value (e.g., "0"). Other binary weight values may be used for first weight value and second weight value. As used herein, the value of a weight stored in an SOT MRAM non-volatile memory cell is also referred to herein as a "multiplicand."

In an embodiment, each SOT MRAM non-volatile memory cell is a "binary non-volatile memory cell," which is a non-volatile memory cell that can be repeatedly switched between two physical states. This is in contrast to a "multi-state non-volatile memory cell" which is a non-volatile memory cell that may be repeatedly switched between more than two physical states.

In an embodiment, each memory cell in the n×m array of SOT MRAM non-volatile memory cells is configured to store one bit of information. In an embodiment, each SOT MRAM non-volatile memory cell may be programmed to either a low resistance state (also referred to herein as an "ON state") or a high resistance state (also referred to herein as an "OFF-state"). In an embodiment, the low resistance state may be used to represent the first weight value (e.g., "1"), and the high resistance state may be used to represent the second weight value (e.g., "0").

In an embodiment, n input voltages (also referred to herein as "multiply voltages") are applied to the first conductive lines (e.g., word lines). In an embodiment, each of the n multiply voltages represents a single-bit binary input, and has either a first input value (e.g., "1V") or a second input value (e.g., "0V"). Other binary voltage values may be used for first input value and second input value. In an embodiment, the n multiply voltages constitute an n-element input vector (also referred to herein as a "multiply vector").

In an embodiment, the memory cells in the n×m array of SOT MRAM non-volatile memory cells generate m output currents at the m second conductive lines (e.g., bit lines). In an embodiment, the m output currents constitute a result of multiplying the n-element input vector (multiply vector) by the n×m array of weights stored in the SOT MRAM non-volatile memory cells. In an embodiment, each of the m output currents represents a single-bit binary output, and has either a first output value (e.g., "1") or a second output value (e.g., "0"). In an embodiment, the m output currents constitute an m-element output vector.

In this regard, multiplication is performed by applying a multiply voltage to a node and processing a current from the SOT MRAM non-volatile memory cell in the node. In an embodiment, each multiply voltage has a magnitude that represents a multiplier. In an embodiment, the multiply voltage is applied across two terminals of the SOT MRAM non-volatile memory cell.

In an embodiment, the SOT MRAM non-volatile memory cell responds to the multiply voltage by conducting a memory cell current in the second conductive line (e.g., bit line) coupled to the SOT MRAM non-volatile memory cell. The magnitude of the memory cell current represents a product of the multiplier applied to the node and the multiplicand stored in the SOT MRAM non-volatile memory cell in the node.

As described above, in an embodiment each SOT MRAM non-volatile memory cell may be programmed to either a low resistance ON-state or a high resistance OFF-state, and each of the n multiply voltages has either a first input value (e.g., "1V") or a second input value (e.g., "0V"). As a result, each of the m output currents represents a single-bit binary output and has either a first output value (e.g., "low current") or a second output value (e.g., "high current").

As described above, technology is described for configuring an n×m array of SOT MRAM non-volatile memory cells to implement a binary neural network. In an embodiment, each SOT MRAM non-volatile memory cell in the array stores a binary weight, n binary inputs are applied to the first conductive lines, and m binary outputs are generated at the second conductive lines.

As used herein, "multiplier" is used for the magnitude of the multiply voltage, and "multiplicand" is used for the value of the weight stored in the SOT MRAM non-volatile memory cell in the node. This is for convenience of discussion. The terms "multiplier" and "multiplicand" are interchangeable.

An example memory system 100 in which embodiments may be practiced will be discussed. FIG. 1A depicts an embodiment of a memory system 100 and a host 102. Memory system 100 may include a non-volatile storage system interfacing with host 102 (e.g., a mobile computing device). In some cases, memory system 100 may be embedded within host 102. In other cases, memory system 100 may include a memory card.

As depicted, memory system 100 includes a memory chip controller 104 and a memory chip 106. Although a single memory chip 106 is depicted, memory system 100 may include more than one memory chip (e.g., four, eight or some other number of memory chips). Memory chip controller 104 may receive data and commands from host 102 and provide data to host 102. In an embodiment, memory system 100 is used to perform matrix-vector multiplication. In an embodiment, memory system 100 is used to perform matrix-vector multiplication in a neuromorphic computing system.

Memory chip controller 104 may include one or more state machines, page registers, SRAM, decoders, sense amplifiers, and control circuitry for controlling the operation of memory chip 106. The one or more state machines, page registers, SRAM, and control circuitry for controlling the operation of memory chip 106 may be referred to as managing or control circuits.

The managing or control circuits may facilitate one or more memory operations, such as programming, reading (or sensing) and erasing operations. In an embodiment, the managing or control circuits are used to perform multiplication using non-volatile memory cells. Herein, multiplication will be referred to as a type of memory operation.

In some embodiments, the managing or control circuits (or a portion of the managing or control circuits) that facilitate one or more memory array operations, including programming, reading, erasing and multiplication operations, may be integrated within memory chip 106. In some embodiments, the managing or control circuits may include an on-chip memory controller for determining row and column address, bit line, source line and word line addresses, memory array enable signals, and data latching signals.

Memory chip controller 104 and memory chip 106 may be arranged on a single integrated circuit. In other embodiments, memory chip controller 104 and memory chip 106 may be arranged on different integrated circuits. In some cases, memory chip controller 104 and memory chip 106 may be integrated on a system board, logic board, or a PCB.

Memory chip 106 includes memory core control circuits 108 and a memory core 110. In an embodiment, memory core control circuits 108 include circuits that generate row and column addresses for selecting memory blocks (or arrays) within memory core 110, and generating voltages to bias a particular memory array into a read or a write state. In an embodiment, memory core control circuits 108 include circuits for generating voltages to bias a memory array to perform matrix-vector multiplication using non-volatile memory cells in memory core 110.

Memory chip controller 104 controls operation of memory chip 106. In an embodiment, once memory chip controller 104 initiates a memory operation (e.g., read, write, or multiply), memory core control circuits 108 generate the appropriate bias voltages for bit lines, source lines and/or word lines within memory core 110, and generates the appropriate memory block, row, and column addresses to perform memory operations.

In an embodiment, memory core 110 includes one or more arrays of non-volatile memory cells used to perform matrix-vector multiplication. In an embodiment, memory core 110 includes one or more arrays of SOT MRAM non-volatile memory cells used to perform matrix-vector multiplication in a neuromorphic computing system. Memory core 110 may include one or more two-dimensional or three-dimensional arrays of SOT MRAM non-volatile memory cells.

In an embodiment, memory core control circuits 108 and memory core 110 are arranged on a single integrated circuit. In other embodiments, memory core control circuits 108 (or a portion of memory core control circuits 108) and memory core 110 may be arranged on different integrated circuits.

In an embodiment, memory core 110 includes a three-dimensional memory array of SOT MRAM non-volatile memory cells in which multiple memory levels are formed above a single substrate, such as a wafer. The memory structure may include SOT MRAM non-volatile memory that is monolithically formed in one or more physical levels of arrays of non-volatile memory cells having an active area disposed above a silicon (or other type of) substrate.

Figure 1B:
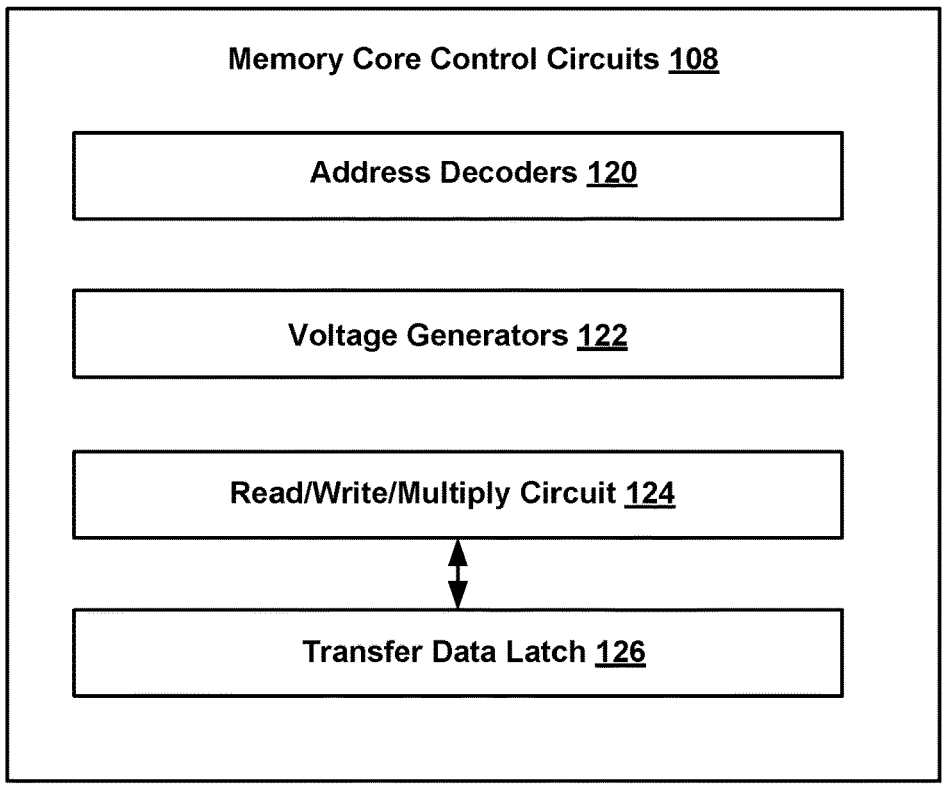
FIG. 1B depicts an embodiment of memory core control circuits.

FIG. 1B depicts an embodiment of memory core control circuits 108. As depicted, memory core control circuits 108 include address decoders 120, voltage generators 122, read/write/multiply circuit 124, and transfer data latch 126. In an embodiment, address decoders 120 generate memory block addresses, as well as row addresses and column addresses for a particular memory block. In an embodiment, voltage generators (or voltage regulators) 122 generate voltages for control lines.

Read/write/multiply circuit 124 includes circuitry for reading and writing non-volatile memory cells in memory core 110. In an embodiment, transfer data latch 126 is used for intermediate storage between memory chip controller 104 (FIG. 1A) and non-volatile memory cells. In an embodiment, transfer data latch 126 has a size equal to a size of a page.

In an embodiment, when host 102 instructs memory chip controller 104 to write data to memory chip 106, memory chip controller 104 writes a page of host data to transfer data latch 126. Read/write/multiply circuit 124 then writes data from transfer data latch 126 to a specified page of non-volatile memory cells.

In an embodiment, when host 102 instructs memory chip controller 104 to read data from memory chip 106, read/write/multiply circuit 124 reads from a specified page of non-volatile memory cells into transfer data latch 126, and memory chip controller 104 transfers the read data from transfer data latch 126 to host 102.

Read/write/multiply circuit 124 also includes circuitry for performing multiplication operations using non-volatile memory cells. In an embodiment, read/write/multiply circuit 124 stores multiplicands (e.g., weights) in the non-volatile memory cells.

In an embodiment, read/write/multiply circuit 124 is configured to apply multiply voltages to SOT MRAM non-volatile memory cells that store multiplicands (e.g., weights). As described above, in an embodiment each multiply voltage has a magnitude that represents a multiplier. In an embodiment, the non-volatile memory cell in a node conducts a memory cell current in response to the multiply voltage applied to the non-volatile memory cell. In an embodiment, the magnitude of the non-volatile memory cell current depends on the physical state of the non-volatile memory cell and the magnitude of the multiply voltage.

For example, in an embodiment the magnitude of a SOT MRAM non-volatile memory cell current depends on the resistance of the SOT MRAM non-volatile memory cell and the voltage applied across two terminals of the SOT MRAM non-volatile memory cell. In an embodiment, the magnitude of the non-volatile memory cell current depends on whether the non-volatile memory cell is in a first physical state or a second physical state. Each physical state may be represented by a physical parameter (e.g., a non-volatile memory cell resistance).

The multiply voltage may be similar in magnitude to a read voltage, in that the multiply voltage may cause the SOT MRAM non-volatile memory cell to conduct a memory cell current without changing the physical state of the SOT MRAM non-volatile memory cell. However, whereas a read voltage may have a magnitude that is selected to delineate between physical states, the magnitude of a multiply voltage is not necessarily selected to delineate between physical states. The following examples of a SOT MRAM non-volatile memory cell programmed to one of two states will be used to illustrate.

In a read operation, after a read voltage is applied the SOT MRAM memory cell current may be sensed and compared with a reference current to determine which state the memory cell is in. For example, the magnitude of the output current corresponding to the read voltage may be compared to a reference current to delineate between the two states. However, the multiply voltage could have one of many different magnitudes, depending on what multiplier is desired. Moreover, the memory cell current that results from applying the multiply voltage is not necessarily compared to a reference current.

In an embodiment, read/write/multiply circuit 124 simultaneously applies a corresponding multiply voltage to each node. Each multiply voltage may correspond to an element of a input vector. The current in each bit line generates a vector multiplication result signal that represents multiplication of the first vector by a second vector.

Figure 1C:
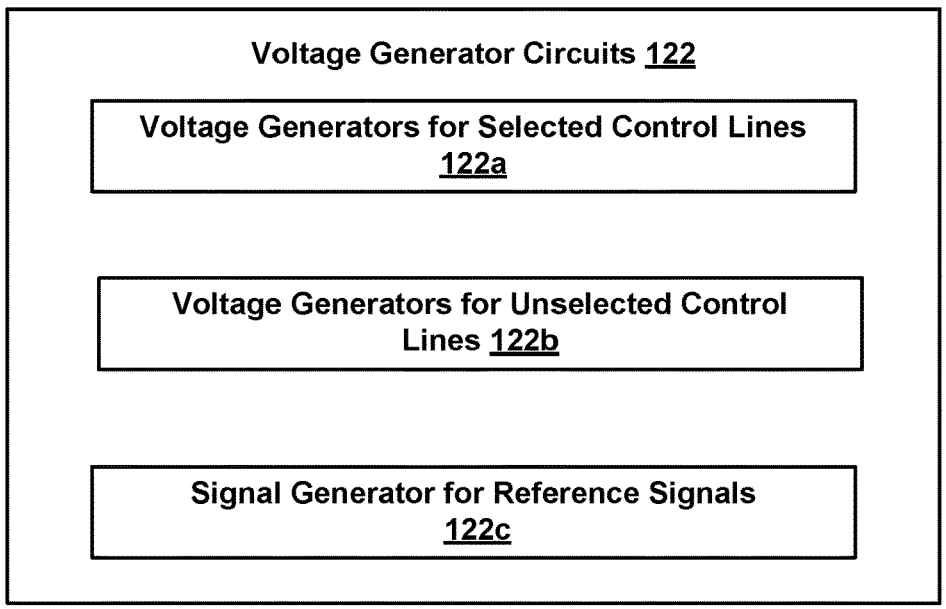
FIG. 1C depicts further details of one embodiment of voltage generators.

FIG. 1C depicts further details of an embodiment of voltage generator circuits 122, which includes voltage generators for selected control lines 122a, voltage generators for unselected control lines 122b, and signal generators for reference signals 122c. Control lines may include bit lines, source lines and word lines, or a combination of bit lines, source lines and word lines.

Voltage generators for selected control lines 122a may be used to generate program, read, and/or multiply voltages. In an embodiment, voltage generators for selected control lines 122a generates a voltage whose magnitude is based on a multiplier for a mathematical multiplication operation. In an embodiment, the voltage difference between the voltages for two selected control lines is a multiply voltage.

Voltage generators for unselected control lines 122b may be used to generate voltages for control lines that are connected to memory cells that are not selected for a program, read, or multiply operation. Signal generators for reference signals 122c may be used to generate reference signals (e.g., currents, voltages) to be used as a comparison signal to determine the physical state of a memory cell.

In an embodiment, non-volatile memory cells are used to perform matrix-vector multiplication in a neuromorphic computing system. A neuromorphic computing system may be used to implement an artificial neural network.

Figures 2A, 2B:
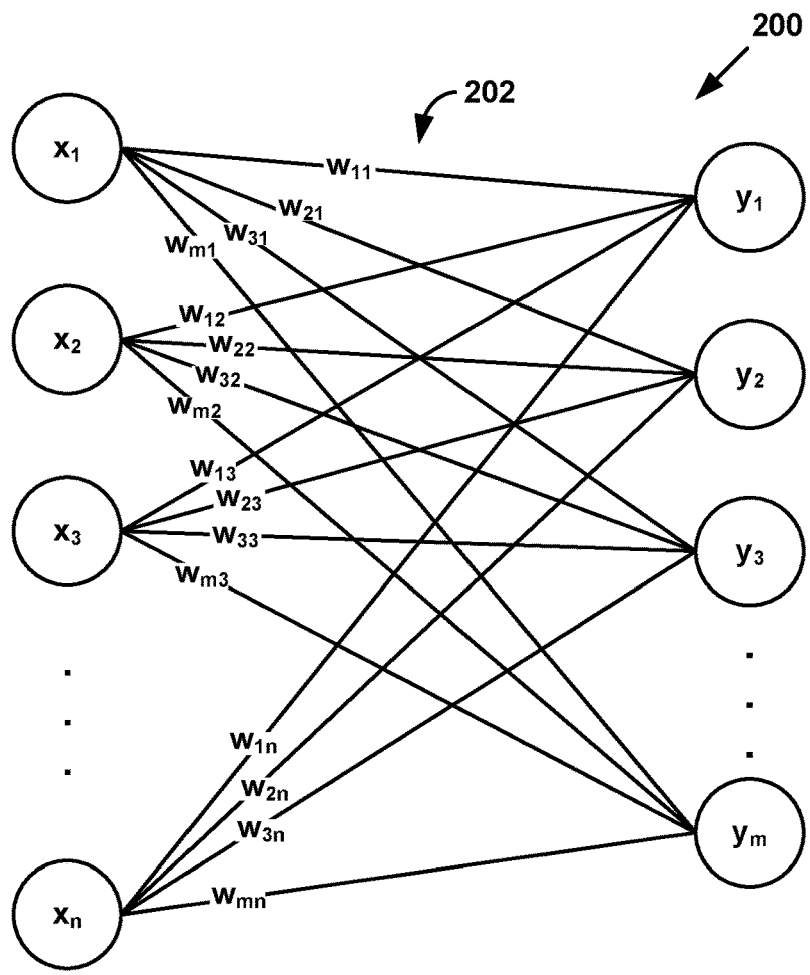
FIG. 2A shows an example of an artificial neural network.
FIG. 2B depicts a matrix-vector multiplication operation of the artificial neural network of FIG. 2A.

FIG. 2A depicts an example of an artificial neural network 200 that includes input neurons $x_1, x_2, x_3, \ldots, x_n$, output neurons $y_1, y_2, y_3, \ldots, y_m$, and synapses 202 that connect input neurons $x_1, x_2, x_3, \ldots, x_n$ to output neurons $y_1, y_2, y_3, \ldots, y_m$. In an embodiment, each synapse 202 has a corresponding weight $w_{11}, w_{12}, w_{13}, \ldots, w_{nm}$.

In an embodiment, each input neuron $x_1, x_2, x_3, \ldots, x_n$ has an associated value, each output neuron $y_1, y_2, y_3, \ldots, y_m$ has an associated value, and each weight $w_{11}, w_{12}, w_{13}, \ldots, w_{nm}$ has an associated value. The value of each output neuron $y_1, y_2, y_3, \ldots, y_m$ may be determined as follows:

$$y_k = \sum_{j=1}^{n} x_j w_{kj}, k = 1, 2, \ldots, m \tag{1}$$

In matrix notation, equation (1) may be written as $y=x^T W$, where y is an m-element output vector, x is an n-element input vector, and W is an n×m array of weights, as depicted in FIG. 2B.

The matrix-vector multiplication operation depicted in FIG. 2B may be implemented by multiply and accumulate operations, in which each output neuron $y_1, y_2, y_3, \ldots, y_m$ has an associated value equal to the sum of products of each input neuron $x_1, x_2, x_3, \ldots, x_n$ with the corresponding weight $w_{11}, w_{12}, w_{13}, \ldots, w_{nm}$ that connects each respective input neuron $x_1, x_2, x_3, \ldots, x_n$ to the output neuron $y_1, y_2, y_3, \ldots, y_m$.

So, for example, with n=4 and m=3, $$y_1 = x_1 w_{11} + x_2 w_{12} + x_3 w_{13} + x_4 w_{14} \quad (2)$$

$$y_2 = x_1 w_{21} + x_2 w_{22} + x_3 w_{23} + x_4 w_{24} \quad (3)$$

$$y_3 = x_1 w_{31} + x_2 w_{32} + x_3 w_{33} + x_4 w_{34} \quad (4)$$

Figure 2C:
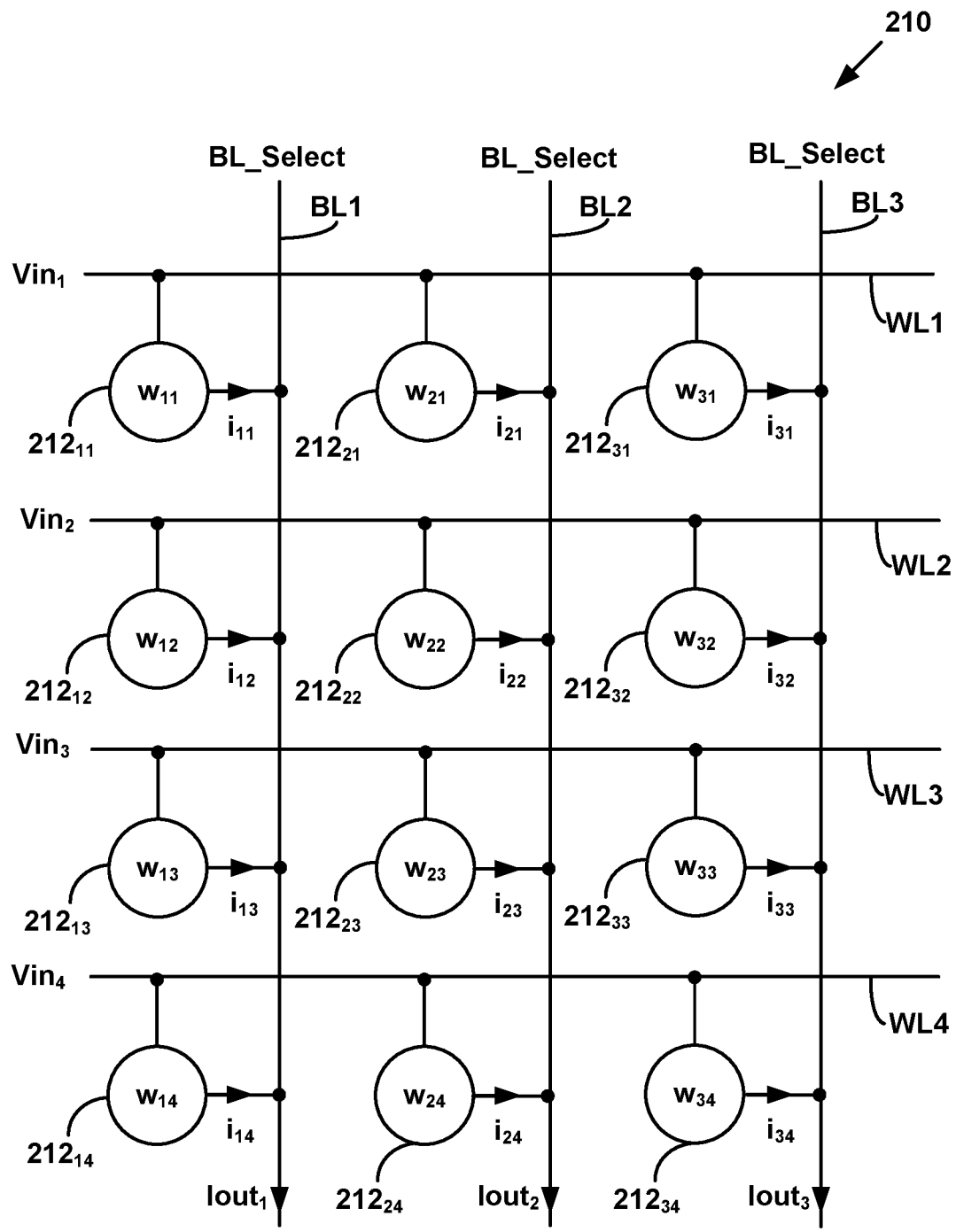
FIG. 2C depicts an example cross-point memory array that may be used to perform the matrix-vector multiplication operation depicted in FIG. 2B.

In an embodiment, a cross-point memory array is used to perform the multiply and accumulate operations described above. FIG. 2C depicts an example cross-point memory array 210 that may be used to perform the matrix-vector multiplication operation depicted in FIG. 2B, with n=4 and m=3.

Cross-point memory array 210 includes n rows and m columns of nodes $212_{11}, 212_{12}, \ldots, 212_{34}$. Each row of nodes $212_{11}, 212_{12}, \ldots, 212_{34}$ is coupled to one of n first conductive lines (e.g., word lines (WL1, WL2, WL3, WL4). Each column of nodes $212_{11}, 212_{12}, \ldots, 212_{34}$ is coupled to one of m second conductive lines (e.g., bit lines BL1, BL2, BL3). Persons of ordinary skill in the art will understand that cross-point memory arrays may include more or fewer that four word lines, and more or fewer than three bit lines, and more or fewer than twelve nodes.

In an embodiment, each node $212_{11}, 212_{12}, \ldots, 212_{34}$ of cross-point memory array 210 includes a non-volatile memory cell having an adjustable resistance. In an embodiment, the non-volatile memory cells in nodes $212_{11}, 212_{12}, \ldots, 212_{34}$ may be programmed to store a corresponding weight of an n×m array of weights $w_{11}, w_{12}, w_{13}, \ldots, w_{34}$, respectively. Thus, each node $212_{11}, 212_{12}, \ldots, 212_{34}$ is labeled with a corresponding weight $w_{11}, w_{12}, w_{13}, \ldots, w_{34}$, respectively, programmed in the corresponding non-volatile memory cell of the node. In an embodiment, each weight $w_{11}, w_{12}, w_{13}, \ldots, w_{34}$ corresponds to a conductance of the non-volatile memory cell in each node $212_{11}, 212_{12}, \ldots, 212_{34}$, respectively. The weights may be programmed, for example, during a training phase of the neural network. A common training method involves the weights being selectively and/or iteratively updated using an algorithm such as back propagation.

Input voltages $Vin_1, Vin_2, Vin_3$ and $Vin_4$ are shown applied to word lines WL1, WL2, WL3, WL4, respectively. The magnitudes of input voltages $Vin_1, Vin_2, Vin_3$ and $Vin_4$ correspond to the associated values of input neurons $x_1, x_2, x_3$ and $x_4$, respectively. A bit line select voltage (BL_Select) is applied to each bit line to select that bit line. For ease of explanation, it will be assumed that BL_Select is zero volts, such that the voltage across the non-volatile memory cell in each node $212_{11}, 212_{12}, \ldots, 212_{34}$ is the word line voltage.

In an embodiment, the non-volatile memory cells in nodes $212_{11}, 212_{12}, \ldots, 212_{34}$ conduct currents $i_{11}, i_{12}, \ldots, i_{34}$, respectively. Each of currents $i_{11}, i_{12}, \ldots, i_{34}$ is based on the voltage applied to the corresponding non-volatile memory cell and the conductance of the corresponding non-volatile memory cell in the node. This "memory cell current" flows to the bit line connected to the non-volatile memory cell. The memory cell current may be determined by multiplying the word line voltage by the conductance of the non-volatile memory cell.

Stated another way, each non-volatile memory cell current corresponds to the result of multiplying one of the elements of an input vector by the weight stored in the non-volatile memory cell. So, for example, the non-volatile memory cell in node $212_{11}$ conducts a current $i_{11}$ that corresponds to the product $Vin_1 \times w_{11}$, the non-volatile memory cell in node $212_{12}$ conducts a current $i_{12}$ that corresponds to the product $Vin_2 \times w_{12}$, the non-volatile memory cell in node $212_{23}$ conducts a current $i_{23}$ that corresponds to the product $Vin_3 \times w_{23}$, and so on.

Bit lines BL1, BL2, BL3 conduct bit line currents $Iout_1, Iout_2, Iout_3$, respectively. Each bit line current is the summation of the currents of the memory cells connected to that bit line. For example, bit line current $Iout_1 = i_{11} + i_{12} + i_{13} + i_{14}$, bit line current $Iout_2 = i_{21} + i_{22} + i_{13} + i_{24}$, and bit line current $Iout_3 = i_{31} + i_{32} + i_{33} + i_{34}$. Thus, each bit line current $Iout_1, Iout_2, Iout_3$ may be viewed as representing an sum of products of the input vector with corresponding weights in a column of the n×m array of weights:

$$Iout_1 = Vin_1 \times w_{11} + Vin_2 \times w_{12} + Vin_3 \times w_{13} + Vin_4 \times w_{14} \quad (5)$$

$$Iout_2 = Vin_1 \times w_{21} + Vin_2 \times w_{22} + Vin_3 \times w_{23} + Vin_4 \times w_{24} \quad (6)$$

$$Iout_3 = Vin_1 \times w_{31} + Vin_2 \times w_{32} + Vin_3 \times w_{33} + Vin_4 \times w_{34} \quad (7)$$

The magnitudes of bit line currents $Iout_1, Iout_2$ and $Iout_3$ constitute elements of an output vector, and correspond to the associated values of output neurons $y_1, y_2$ and $y_3$, respectively, and constitute the result of the matrix-vector multiplication operation depicted in FIG. 2B.

Figure 3A:
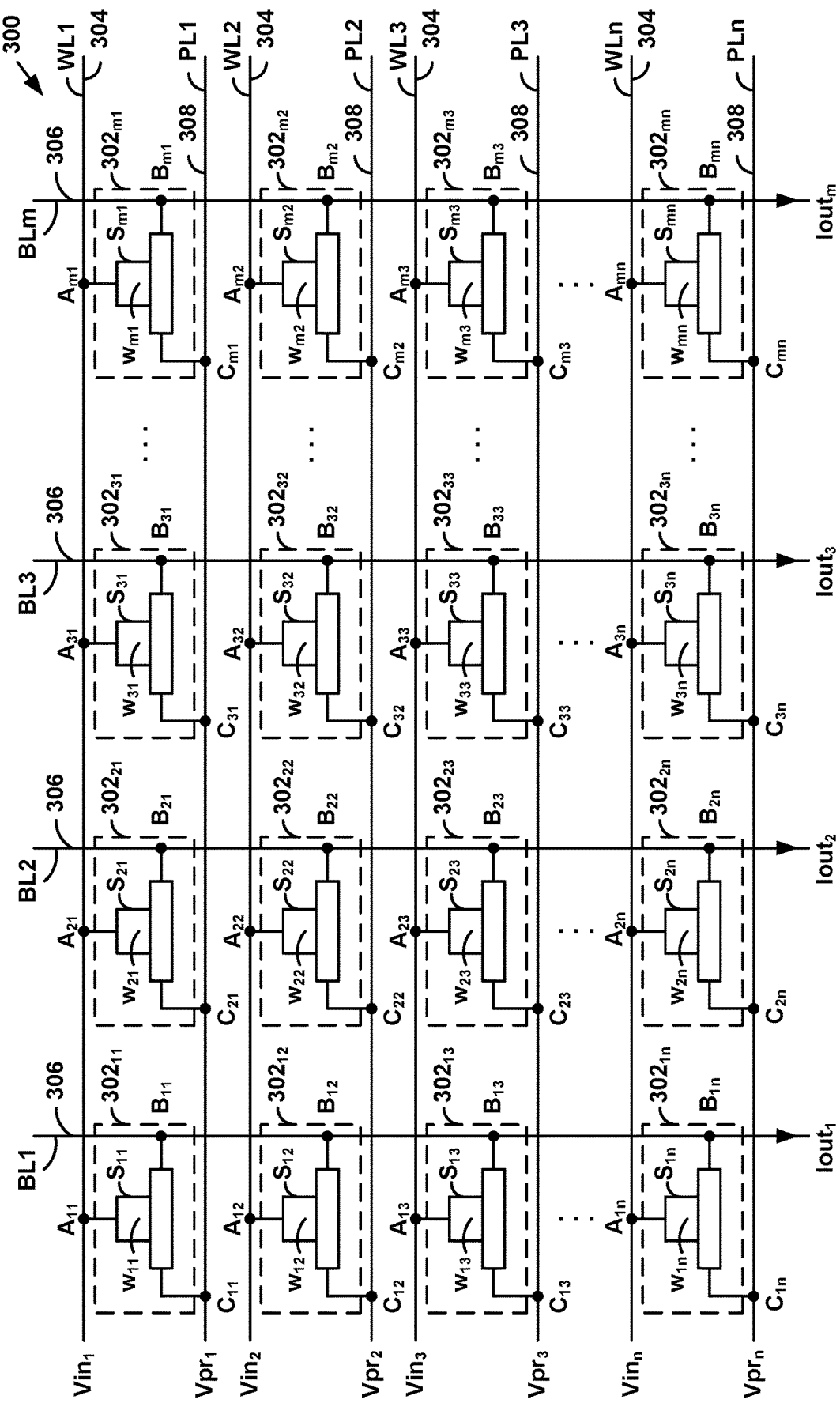
FIG. 3A depicts an embodiment of an apparatus that may be used to perform the matrix-vector multiplication operation depicted in FIG. 2B.

FIG. 3A is a simplified diagram of an embodiment of an apparatus 300 that may be used to perform the matrix-vector multiplication operation depicted in FIG. 2B. In an embodiment, apparatus 300 may be included in memory system 100 (FIG. 1A). In an embodiment, apparatus 300 may be included in memory chip 106 (FIG. 1A). In an embodiment, apparatus 300 may be used to perform multiply accumulate operations, such as matrix-vector multiplication in a neuromorphic computing system.

Apparatus 300 in a cross-point memory array that includes n rows and m columns of nodes $302_{11}, 302_{12}, \ldots, 302_{mn}$. Apparatus 300 will also be referred to herein as cross-point memory array 300. In an embodiment, each of nodes $302_{11}, 302_{12}, \ldots, 302_{mn}$ includes a corresponding non-volatile memory cell $S_{11}, S_{12}, \ldots, S_{mn}$, respectively. In other embodiments, cross-point memory array 300 may include more than one non-volatile memory cell per node.

Each row of nodes $302_{11}, 302_{12}, \ldots, 302_{mn}$ is coupled to one of n first conductive lines 304, also referred to herein as word lines WL1, WL2, ..., WLn. For example, the row of nodes $302_{11}, 302_{21}, 302_{31}, \ldots, 302_{m1}$ is coupled to word line WL1, the row of nodes $302_{13}, 302_{23}, 302_{33}, \ldots, 302_{m3}$ is coupled to word line WL3, and so on.

In an embodiment, each column of nodes $302_{11}, 302_{12}, \ldots, 302_{mn}$ is coupled to one of m second conductive lines 306, also referred to herein as bit lines BL1, BL2, ..., BLm. For example, the column of nodes $302_{11}, 302_{12}, 302_{13}, \ldots, 302_{1n}$ is coupled to bit line BL1, the column of nodes $302_{21}, 302_{22}, 302_{23}, \ldots, 302_{2n}$ is coupled to bit line BL2, and so on.

In an embodiment, each row of nodes $302_{11}, 302_{12}, \ldots, 302_{mn}$ is coupled to one of n third conductive lines 308, also referred to as programming lines PL1, PL2, . . . , PLn. For example, the row of nodes $302_{11}$, $302_{21}$, $302_{31}$, . . . , $302_{m1}$ is coupled to programming line PL1, the row of nodes $302_{1n}$, $302_{2n}$, $302_{3n}$, . . . , $302_{mn}$ is coupled to programming line PLn, and so on.

Each non-volatile memory cell $S_{11}$, $S_{12}$, . . . , $S_{mn}$ has a first terminal $A_{11}$, $A_{12}$, . . . , $A_{mn}$, respectively, coupled to one of the n word lines WL1, WL2, . . . , WLn, a second terminal $B_{11}$, $B_{12}$, . . . , $B_{mn}$, respectively, coupled to one of the m bit lines BL1, BL2, . . . , BLm, and a third terminal $C_{11}$, $C_{12}$, . . . , $C_{mn}$, respectively, coupled to one of the n programming lines PL1, PL2, . . . , PLn. To simplify this discussion and to avoid overcrowding the diagram, access devices are not depicted in FIG. 3A.

For example, non-volatile memory cell $S_{11}$ has a first terminal $A_{11}$ coupled to word line WL1, a second terminal $B_{11}$ coupled to bit line BL1, and a third terminal $C_{11}$ coupled to programming line PL1. Likewise, non-volatile memory cell $S_{32}$ has a first terminal $A_{32}$ coupled to word line WL2, a second terminal $B_{32}$ coupled to bit line BL3, and a third terminal coupled $C_{32}$ to programming line PL2.

In an embodiment, each non-volatile memory cell $S_{11}$, $S_{12}$, . . . , $S_{mn}$ is an SOT MRAM non-volatile memory cell, such as the example SOT MRAM non-volatile memory cell 310a depicted in FIG. 3B1 (cross-sectional view) and FIG. 3C (top-down view). SOT MRAM non-volatile memory cell 310a includes a first terminal A, a second terminal B, a third terminal C, a magnetic tunnel junction (MTJ) 312a, and a Spin Hall Effect (SHE) layer 314. As depicted in FIG. 3C, MTJ 312a has a substantially cylindrical shape.

MTJ 312a includes a reference (or pinned) layer (PL) 316a, a free layer (FL) 318a, and a tunnel barrier (TB) 320 positioned between pinned layer 316a and free layer 318a. Tunnel barrier 320 is an insulating layer, such as magnesium oxide (MgO) or other insulating material. Pinned layer 316a is a ferromagnetic layer with a fixed direction of magnetization. Free layer 318a is a ferromagnetic layer and has a direction of magnetization that can be switched.

Pinned layer 316a is usually a synthetic antiferromagnetic layer which includes several magnetic and non-magnetic layers, but for the purpose of this illustration is depicted as a single layer 316a with fixed direction of magnetization. Pinned layer 316a and free layer 318a each have a perpendicular direction of magnetization. Accordingly SOT MRAM non-volatile memory cell 310a is also referred to herein as "perpendicular stack SOT MRAM non-volatile memory cell 310a."

When the direction of magnetization of free layer 318a is parallel to the direction of magnetization of pinned layer 316a, the resistance of perpendicular stack SOT MRAM non-volatile memory cell 310a is relatively low. When the direction of magnetization of free layer 318a is anti-parallel to the direction of magnetization in pinned layer 316a, the resistance of perpendicular stack SOT MRAM non-volatile memory cell 310a is relatively high.

Thus, the resistance of perpendicular stack SOT MRAM non-volatile memory cell 310a may therefore be used to store one bit of data. In an embodiment, SOT MRAM non-volatile memory cell 310a may be programmed to either a low resistance ON state or a high resistance OFF state. In an embodiment, the low resistance ON state may be used to represent a first weight value (e.g., "1"), and the high resistance OFF state may be used to represent a second weight value (e.g., "0").

The data ("0" or "1") in SOT MRAM non-volatile memory cell 310a may be read by measuring the resistance of SOT MRAM non-volatile memory cell 310a.

FIG. 3B2 is a cross-sectional view of another SOT MRAM non-volatile memory cell 310b that may be included in each non-volatile memory cell $S_{11}$, $S_{12}$, . . . , $S_{mn}$ (FIG. 3A). SOT MRAM non-volatile memory cell 310b includes first terminal A, second terminal B, third terminal C, a MTJ 312b having a pinned layer PL 316b and a free layer FL 318b that each have a direction of magnetization that is in an in-plane direction, and SHE layer 314. Accordingly SOT MRAM non-volatile memory cell 310b is also referred to herein as "in-plane stack SOT MRAM non-volatile memory cell 310b."

When the direction of magnetization of free layer 318b is parallel to the direction of magnetization of pinned layer 316b, the resistance of in-plane stack SOT MRAM non-volatile memory cell 310b is relatively low. When the direction of magnetization of free layer 318b is anti-parallel to the direction of magnetization in pinned layer 316b, the resistance of in-plane stack SOT MRAM non-volatile memory cell 310b is relatively high.

Thus, the resistance of in-plane stack SOT MRAM non-volatile memory cell 310b may therefore be used to store one bit of data. In an embodiment, SOT MRAM non-volatile memory cell 310b may be programmed to either a low resistance ON state or a high resistance OFF state. In an embodiment, the low resistance ON state may be used to represent a first weight value (e.g., "1"), and the high resistance OFF state may be used to represent a second weight value (e.g., "0"). The data ("0" or "1") in SOT MRAM non-volatile memory cell 310b may be read by measuring the resistance of SOT MRAM non-volatile memory cell 310b.

FIG. 3D1 is a top-down view of an embodiment of in-plane stack SOT MRAM non-volatile memory cell 310b. In this embodiment, MTJ 312b has an ellipsoidal shape, and pinned layer 316b and free layer 318b each have an easy axis perpendicular to current flow in SHE layer 314. FIG. 3D2 is a top-down view of another embodiment of in-plane stack SOT MRAM non-volatile memory cell 310b. In this embodiment, MTJ 312b has an ellipsoidal shape, and pinned layer 316b and free layer 318b each have an easy axis that is at an angle α off-perpendicular to current flow in SHE layer 314. In embodiments, angle α may be between about 0° to about 30°, although other angles may be used.

Referring again to FIG. 3B1, in an embodiment, SHE layer 314 comprises a heavy metal with strong spin orbit coupling and large effective Spin Hall Angle. Examples of heavy metal materials include platinum, tungsten, tantalum, platinum gold (PtAu), bismuth bopper (BiCu). In other embodiments, SHE layer 314 comprises a topological insulator, such as bismuth antimony (BiSb), bismuth selenide ($Bi_2Se_3$), bismuth telluride ($Bi_2Te_3$) or antimony telluride ($Sb_2Te_3$). In particular embodiments, SHE layer 314 comprises BiSb with (012) orientation, which is a narrow gap topological insulator with both giant Spin Hall Effect and high electrical conductivity.

The spin of an electron is an intrinsic angular momentum. In a solid, the spins of many electrons can act together to affect the magnetic and electronic properties of a material, for example endowing it with a permanent magnetic moment as in a ferromagnet. In many materials, electron spins are equally present in both up and down directions. However, various techniques can be used to generate a spin-polarized population of electrons, resulting in an excess of spin up or spin down electrons, to change the properties of a material. This spin-polarized population of electrons moving in a common direction through a common material is referred to as a spin current.

The Spin Hall Effect is a transport phenomenon that may be used to generate a spin current in a sample carrying an electric current. The spin current is in a direction perpendicular to the plane defined by the electrical current direction and the spin polarization direction. The spin polarization direction of such a SHE-generated spin current is in the in-plane direction orthogonal to the electrical current flow.

For example, an electrical current 322 through SHE layer 314 (from third terminal C to second terminal B) results in a spin current 324 being injected up into free layer 318a, and having a direction of polarization into the page. Spin current 324 injected into free layer 318a exerts a spin torque (or "kick") on free layer 318a, which causes the direction of magnetization of free layer 318a to oscillate in the y-z plane.

Figure 3E:
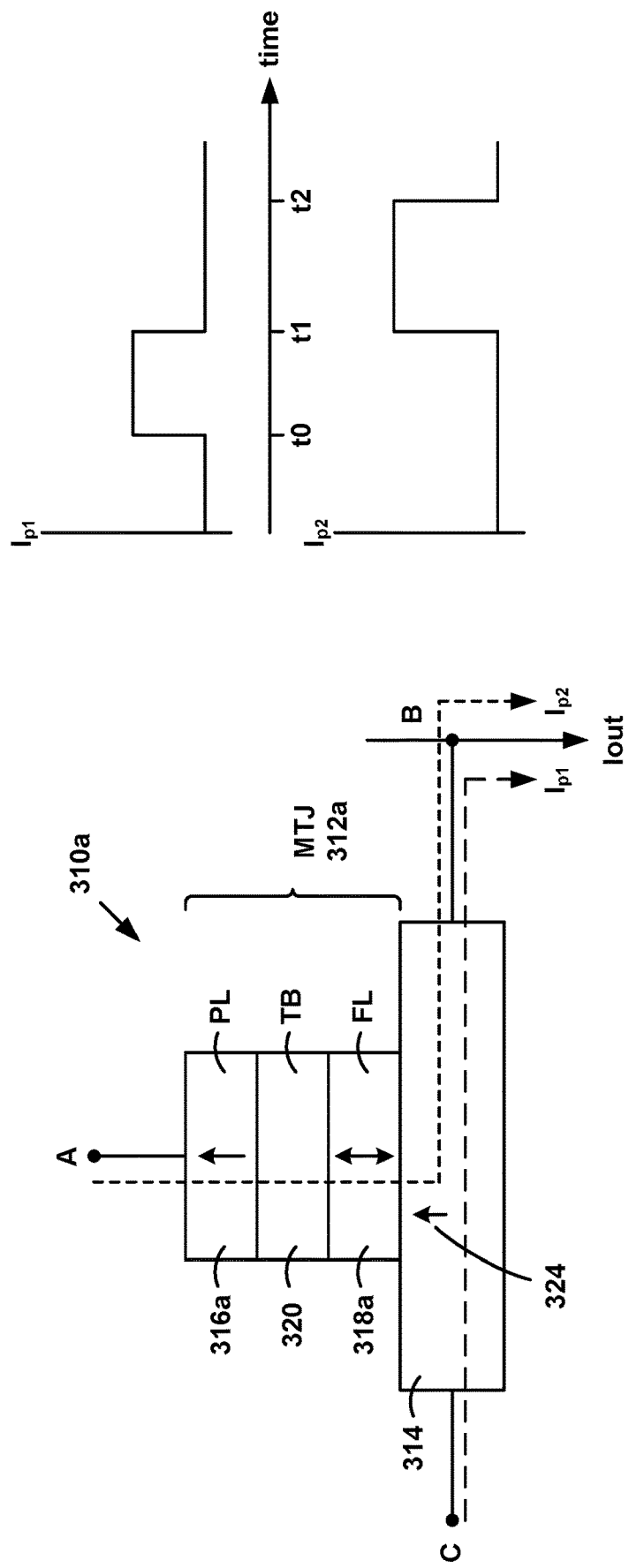
FIG. 3E illustrates a technique for programming a perpendicular stack SOT MRAM non-volatile memory cell of FIG. 3B1.

FIG. 3E illustrates a technique for programming perpendicular stack SOT MRAM non-volatile memory cell 310a. Programming may occur as part of training the neural network, where the weights stored in the individual cells may be selectively and iteratively updated. In an embodiment, perpendicular stack SOT MRAM non-volatile memory cell 310a is programmed in a two-step process. In a first step, a first electrical current pulse $I_{p1}$ is applied through SHE layer 314 from third terminal C to second terminal B. First electrical current pulse $I_{p1}$ results in spin current 324 injected into free layer 318a to kick the direction of magnetization of free layer 318a into oscillation.

In a second step, a second electrical current pulse $I_{p2}$ is applied through MTJ 312a and SHE layer 314 from first terminal A to second terminal B. Second electrical current pulse $I_{p2}$ generates a spin torque along the easy axis of free layer 318a, but opposite to the initial direction of magnetization of free layer 318a, to switch the direction of magnetization of free layer 318a. In embodiments, the amplitude and pulse width of first electrical current pulse $I_{p1}$ can be the same as or different from the amplitude and pulse width of second electrical current pulse $I_{p2}$. In an embodiment, the amplitude of first electrical current pulse $I_{p1}$ is less than the amplitude of second electrical current pulse $I_{p2}$.

Figure 3F:
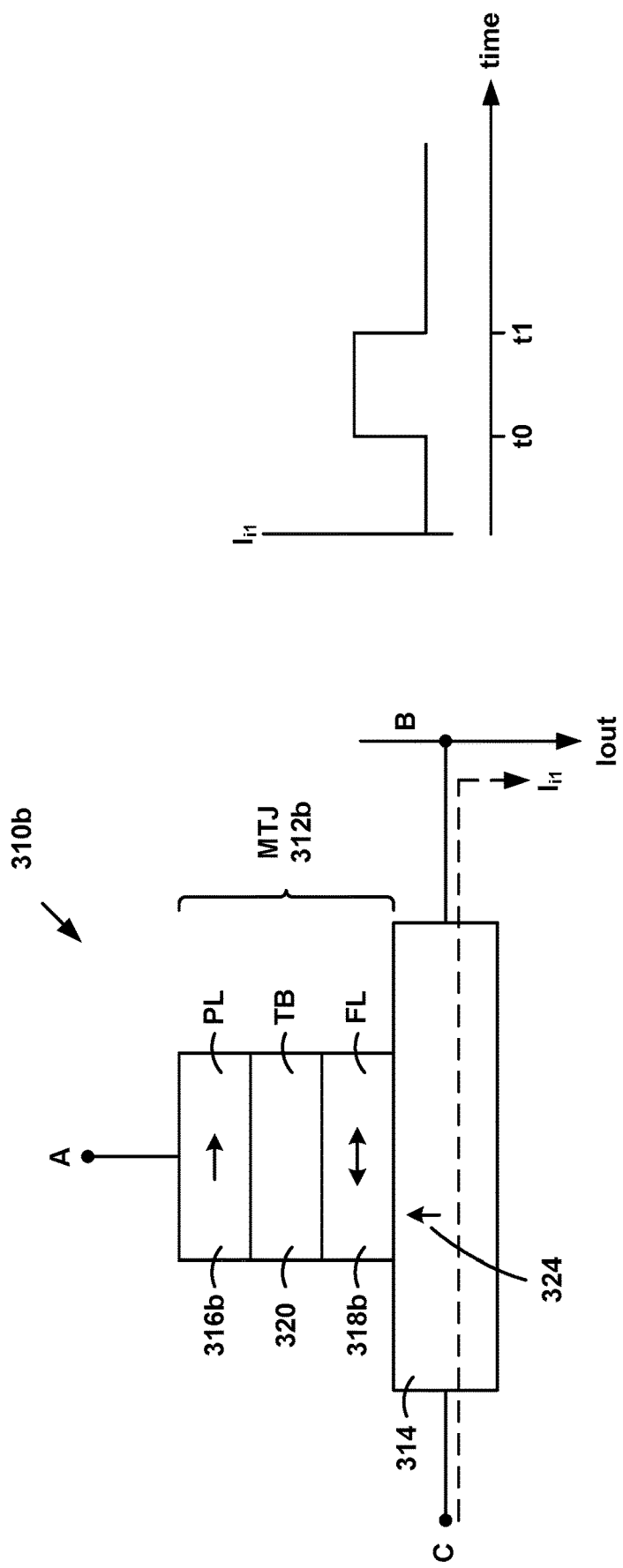
FIG. 3F illustrates a technique for programming an in-plane stack SOT MRAM non-volatile memory cell of FIG. 3B2.

FIG. 3F illustrates a technique for programming in-plane stack SOT MRAM non-volatile memory cell 310b. Programming may occur as part of training the neural network, where the weights stored in the individual cells may be selectively and iteratively updated. In an embodiment, in-plane stack SOT MRAM non-volatile memory cell 310b is programmed by applying a first electrical current pulse $I_{11}$ through SHE layer 314 from third terminal C to second terminal B. First electrical current pulse $I_{11}$ results in spin current 324 injected into free layer 318b that results in a spin torque in free layer 318b opposite to the initial direction of magnetization of free layer 318b, switching the direction of magnetization of free layer 318b.

Referring again to FIG. 3A and as described above, in an embodiment each non-volatile memory cell $S_{11}$, $S_{12}$, ..., $S_{mn}$ is an SOT MRAM non-volatile memory cell, and will also be referred to herein as SOT MRAM non-volatile memory cells $S_{11}$, $S_{12}$, ..., $S_{mn}$. For simplicity, in the remaining discussion SOT MRAM non-volatile memory cells $S_{11}$, $S_{12}$, ..., $S_{mn}$ will be assumed to be perpendicular stack SOT MRAM non-volatile memory cells, such as described above and depicted in FIG. 3E. Persons of ordinary skill in the art will understand that SOT MRAM non-volatile memory cells $S_{11}$, $S_{12}$, ..., $S_{mn}$ alternatively may be in-plane stack SOT MRAM non-volatile memory cells, such as described above and depicted in FIG. 3F.

In an embodiment, during a "programming phase," each SOT MRAM non-volatile memory cell $S_{11}$, $S_{12}$, ..., $S_{mn}$ is programmed to store a corresponding weight of an n×m array of weights $w_{11}$, $w_{12}$, $w_{13}$, ..., $w_{nm}$, respectively. For example, the programming techniques described above with respect to FIG. 3E (for perpendicular stack SOT MRAM non-volatile memory cells) or FIG. 3F (for in-plane stack SOT MRAM non-volatile memory cells) may be used to store weights $w_{11}$, $w_{12}$, $w_{13}$, ..., $w_{nm}$ in SOT MRAM non-volatile memory cell $S_{11}$, $S_{12}$, ..., $S_{mn}$, respectively.

As described above, in an embodiment, each of weights $w_{11}$, $w_{12}$, $w_{13}$, ..., $w_{nm}$ is a single-bit binary weight, and has either a first weight value (e.g., "1") or a second weight value (e.g., "0"). In such an embodiment, during the programming phase SOT MRAM non-volatile memory cell $S_{11}$, $S_{12}$, ..., $S_{mn}$ are programmed to either a low resistance ON state (e.g., to represent the first weight value "1") or a high resistance OFF state (e.g., to represent the second weight value "0").

After SOT MRAM non-volatile memory cells $S_{11}$, $S_{12}$, ..., $S_{mn}$ have been programmed with weights $w_{11}$, $w_{12}$, $w_{13}$, ..., $w_{nm}$, respectively, e.g., as part of training a neural network, cross-point memory array 300 may be used during an "inferencing phase" to perform the matrix-vector multiplication operation depicted in FIG. 2B. In particular, multiply voltages $Vin_1$, $Vin_2$, ..., $Vin_n$ are applied to word lines WL1, WL2, ..., WLn, respectively. In an embodiment, read/write/multiply circuit 124 is configured to apply multiply voltages $Vin_1$, $Vin_2$, ..., $Vin_n$ to word lines WL1, WL2, ..., WLn, respectively. The magnitudes of voltages $Vin_1$, $Vin_2$, ..., $Vin_n$ correspond to the associated values of input neurons $x_1$, $x_2$, ..., $x_n$, respectively, and hence multiply voltages $Vin_1$, $Vin_2$, ..., $Vin_n$ constitute an n-element input vector (multiply vector).

In an embodiment, during the inferencing phase, third conductive lines 308 (programming lines PL1, PL2, ..., PLn) are not used, and may be floated. In addition, for simplicity it will be assumed that bit line select voltages of 0 volts are applied to each of bit lines BL1, BL2, ..., BLm to select those bit lines. In an embodiment, read/write/multiply circuit 124 is configured to apply bit line select voltages of 0 volts to bit lines BL1, BL2, ..., BLm.

During the inferencing phase, each SOT MRAM non-volatile memory cell $S_{11}$, $S_{12}$, ..., $S_{mn}$ conducts a memory cell current that corresponds to the result of multiplying one of the elements of the n-element input vector (multiply vector) by the corresponding weight stored in the non-volatile memory cell. For example, SOT MRAM non-volatile memory cell $S_{11}$ conducts a memory cell current that corresponds to the product $Vin_1 \times w_{11}$, SOT MRAM non-volatile memory cell $S_{12}$ conducts a memory cell current that corresponds to the product $Vin_2 \times w_{12}$, SOT MRAM non-volatile memory cell $S_{23}$ conducts a memory cell current that corresponds to the product $Vin_3 \times w_{23}$, and so on.

During the inferencing phase, the memory cell currents in SOT MRAM non-volatile memory cells $S_{11}$, $S_{12}$, ..., $S_{mn}$ flow to the bit line BL1, BL2, ..., BLm connected to the memory cell. Bit lines BL1, BL2, ..., BLm conduct bit line currents $Iout_1$, $Iout_2$, ..., $Iout_m$, respectively. Each bit line current is the summation of the memory cell currents of the memory cells connected to that bit line. Thus, each bit line current $Iout_1$, $Iout_2$, ..., $Iout_m$ may be viewed as representing a sum of products of the multiply vector with corresponding weights in a column of the n×m array of weights $$Iout_1 = Vin_1 \times w_{11} + Vin_2 \times w_{12} + \ldots Vin_n \times w_{1n} \quad (8)$$

$$Iout_2 = Vin_1 \times w_{21} + Vin_2 \times w_{22} + \ldots Vin_n \times w_{2n} \quad (9)$$

$$Iout_m = Vin_1 \times w_{m1} + Vin_2 \times w_{m2} + \ldots Vin_n \times w_{mn} \quad (10)$$

The magnitudes of bit line currents $Iout_1, Iout_2, \ldots, Iout_m$ constitute elements of an m-element output vector, and correspond to the associated values of output neurons $y_1, y_2, \ldots, y_m$, respectively, and constitute the result of the matrix-vector multiplication operation depicted in FIG. 2B.

The magnitude of each individual bit line current $I_k$ represents a vector-vector multiplication result. That is, the magnitude of bit line current $I_k$ represents the result of multiplying the input vector $Vin_1, Vin_2, \ldots, Vin_n$ by the k-th column vector of the n×m array of weights $w_{11}, w_{12}, w_{13}, \ldots, w_{nm}$.

Collectively, bit line currents $Iout_1, Iout_2, \ldots Iout_m$ represent a result of matrix-vector multiplication. In an embodiment, bit line currents $Iout_1, Iout_2, \ldots, Iout_m$ represent output neurons $y_1, y_2, y_3, \ldots, y_m$, respectively, of artificial neural network 200 of FIG. 2A. Because one node SOT MRAM non-volatile memory cell $S_{11}, S_{12}, \ldots, S_{mn}$ in each column is connected to the same first conductive line 308, the matrix-vector multiplication is very efficient. Essentially, m vector-vector multiplications are performed in parallel.

In an embodiment, a sense amplifier is used to compare the magnitude of each bit line current $Iout_1, Iout_2, \ldots, Iout_m$ to a reference current. The sense amplifier may output a signal (e.g., one bit of information) that indicates whether the magnitude of the bit line current is less than or greater than the reference current. In an embodiment, the magnitude of the bit line current may be input to an activation function in an artificial neural network. The activation function may take various forms (e.g., Rectified Linear Unit (ReLu)) and may involve operations on the bit line current other than comparing to a reference current. In some applications, the activation function outputs a "fire" or "don't fire" signal based on the magnitude of the summed signal.

Figure 3G:
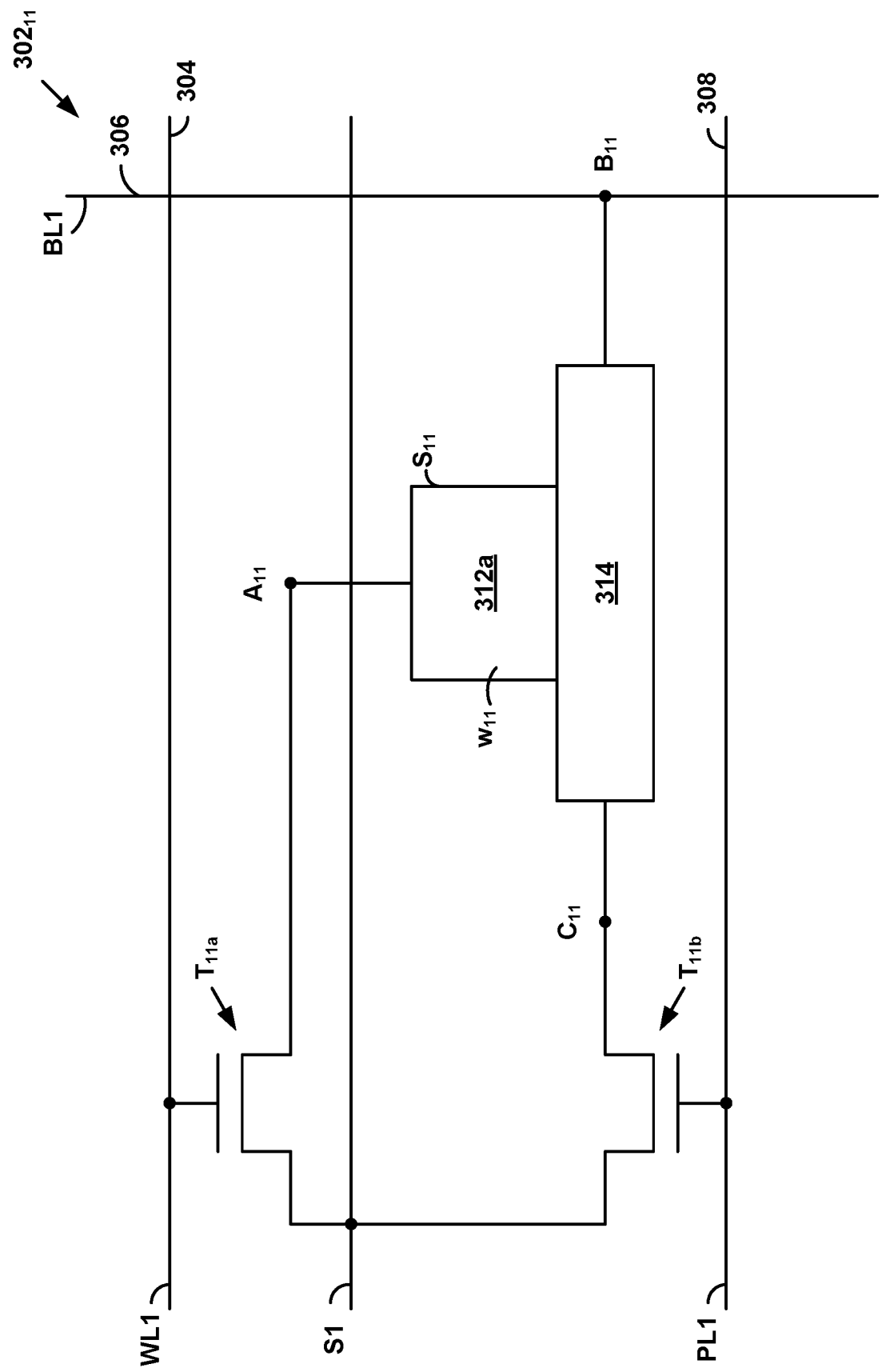
FIG. 3G depicts another example SOT MRAM non-volatile memory cell of the apparatus of FIG. 3A.

As described above, to avoid overcrowding the diagram, access devices are not depicted in FIG. 3A. FIG. 3G is a diagram of node $302_{11}$ that includes a first access device $T_{11a}$, a second access device $T_{11b}$, and a signal line S1. SOT MRAM non-volatile memory cell $S_{11}$ includes first terminal $A_{11}$ coupled via first access device $T_{11a}$ to first conductive line 304 (word line WL1), second terminal $B_{11}$ coupled to second conductive line 306 (bit line BL1), and third terminal $C_{11}$ coupled via second access device $T_{11b}$ to third conductive line 308 (programming line PL1).

In an embodiment, first access device $T_{11a}$ and second access device $T_{11b}$ are each MOS transistors, although other types of access device may be used. First access device $T_{11a}$ has a first drain/source terminal coupled to signal line S1, a second drain/source terminal coupled to first terminal $A_{11}$ of SOT MRAM non-volatile memory cell $S_{11}$, and a control (gate) terminal coupled to first conductive line 304 (word line WL1). Second access device $T_{11b}$ has a first drain/source terminal coupled to signal line S1, a second drain/source terminal coupled to third terminal $C_{11}$ of SOT MRAM non-volatile memory cell $S_{11}$, and a control (gate) terminal coupled to third conductive line 308 (programming line PL1).

In an embodiment, to selectively program SOT MRAM non-volatile memory cell $S_{11}$, control signals are applied to first conductive line 304 (word line WL1) and third conductive line 308 (programming line PL1), while appropriate programming signals are applied to signal line S1. For example, assuming that SOT MRAM non-volatile memory cell $S_{11}$ is a perpendicular stack SOT MRAM non-volatile memory cell, the programming technique described above and depicted in FIG. 3E may be used to program SOT MRAM non-volatile memory cell $S_{11}$.

In a first programming step, first conductive line 304 (word line WL1) is LOW, third conductive line 308 (programming line PL1) is HIGH, first access device $T_{11a}$ is OFF, second access device $T_{11b}$ is ON, and a first electrical current pulse $I_{p1}$ is applied to signal line S1. As a result, first electrical current pulse $I_{p1}$ is applied through SHE layer 314 from third terminal $C_{11}$ to second terminal $B_{11}$.

In a second programming step, first conductive line 304 (word line WL1) is HIGH, third conductive line 308 (programming line PL1) is LOW, first access device $T_{11a}$ is ON, second access device $T_{11b}$ is OFF, and a second electrical current pulse $I_{p2}$ is applied to signal line S1. As a result, second electrical current pulse $I_{p2}$ is applied through MTJ 312a and SHE layer 314 from first terminal $A_{11}$ to second terminal $B_{11}$ to program SOT MRAM non-volatile memory cell $S_{11}$ with weight $w_{11}$.

During inferencing, first conductive line 304 (word line WL1) is HIGH, third conductive line 308 (programming line PL1) is LOW, first access device $T_{11a}$ is ON, second access device $T_{11b}$ is OFF, and multiply voltage $Vin_1$ is applied to signal line S1 while a bit line select voltage (e.g., 0V) is applied to second conductive line 306 (bit line BL1). As a result, multiply voltage $Vin_1$ is applied across first terminal $A_{11}$ and second terminal $B_{11}$ of SOT MRAM non-volatile memory cell $S_{11}$, and SOT MRAM non-volatile memory cell $S_{11}$, conducts a memory cell current that corresponds to the product $Vin_1 \times w_{11}$.

Similar programming and inferencing techniques to those described above in connection with SOT MRAM non-volatile memory cell $S_{11}$ of FIG. 3G may be used for programming and inferencing SOT MRAM non-volatile memory cells $S_{11}, S_{12}, \ldots, S_{mn}$ of FIG. 3A. In an embodiment, each row of SOT MRAM non-volatile memory cells $S_{11}, S_{12}, \ldots, S_{mn}$ is coupled to the same signal line S1 so that all SOT MRAM non-volatile memory cells in the row receive the same multiply voltage $Vin_1, Vin_2, \ldots, Vin_n$.

Figure 4:
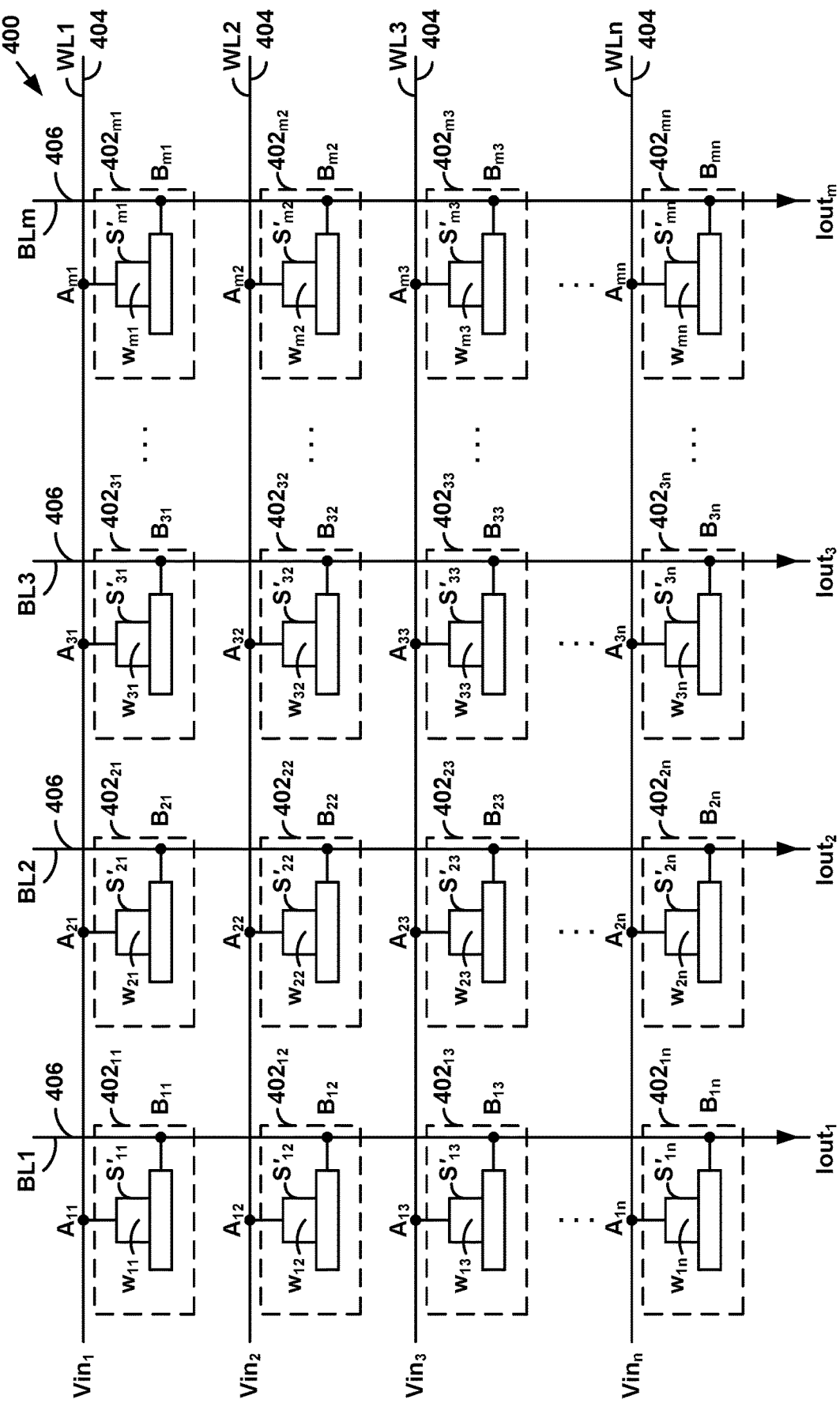
FIG. 4 depicts another embodiment of an apparatus that may be used to perform the matrix-vector multiplication operation depicted in FIG. 2B.

FIG. 4 is a simplified diagram of an embodiment of an apparatus 400 that may be used to perform the matrix-vector multiplication operation depicted in FIG. 2B. In an embodiment, apparatus 400 may be included in memory system 100 (FIG. 1A). In an embodiment, apparatus 400 may be included in memory chip 106 (FIG. 1A). In an embodiment, apparatus 400 may be used to perform multiply accumulate operations, such as matrix-vector multiplication in a neuromorphic computing system.

Apparatus 400 in a cross-point memory array that includes n rows and m columns of nodes $402_{11}, 402_{12}, \ldots, 402_{mn}$. Apparatus 400 will also be referred to herein as cross-point memory array 400. In an embodiment, each of nodes $402_{11}, 402_{12}, \ldots, 402_{mn}$ includes a corresponding non-volatile memory cell $S'_{11}, S'_{12}, \ldots, S'_{mn}$, respectively. In other embodiments, cross-point memory array 400 may include more than one non-volatile memory cell per node.

Each row of nodes $402_{11}, 402_{12}, \ldots, 402_{mn}$ is coupled to one of n first conductive lines 404, also referred to herein as word lines WL1, WL2, ..., WLn. For example, the row of nodes $402_{11}, 402_{21}, 402_{31}, \ldots, 402_{m1}$ is coupled to word line WL1, the row of nodes $402_{13}, 402_{23}, 402_{33}, \ldots, 402_{m3}$ is coupled to word line WL3, and so on.

In an embodiment, each column of nodes $402_{11}, 402_{12}, \ldots, 402_{mn}$ is coupled to one of m second conductive lines 406, also referred to herein as bit lines BL1, BL2, ..., BLm. For example, the column of nodes $402_{11}$, $402_{12}, 402_{13}, \ldots, 402_{1n}$ is coupled to bit line BL1, the column of nodes $402_{21}, 402_{22}, 402_{23}, \ldots, 402_{2n}$ is coupled to bit line BL2, and so on.

Each non-volatile memory cell $S'_{11}, S'_{12}, \ldots, S'_{mn}$ has a first terminal $A_{11}, A_{12}, \ldots, A_{mn}$, respectively, coupled to one of the n word lines WL1, WL2, .. WLn, and a second terminal $B_{11}, B_{12}, \ldots, B_{mn}$, respectively, coupled to one of the m bit lines BL1, BL2, ..., BLm. To simplify this discussion and to avoid overcrowding the diagram, access devices are not depicted in FIG. 4.

In embodiment, each non-volatile memory cell $S'_{11}, S'_{12}, \ldots, S'_{mn}$ is an SOT MRAM non-volatile memory cell, such as the example perpendicular stack SOT MRAM non-volatile memory cell 310a depicted in FIG. 3B1, or the example in-plane stack SOT MRAM non-volatile memory cell 310b depicted in FIG. 3B2.

Cross-point memory array 400 of FIG. 4 is similar to cross-point memory array 300 of FIG. 3A, except that SOT MRAM non-volatile memory cells $S'_{11}, S'_{12}, \ldots, S'_{mn}$ of cross-point memory array 400 are two-terminal memory cells, and SOT MRAM non-volatile memory cells $S_{11}, S_{12}, \ldots, S_{mn}$ of cross-point memory array 300 are three-terminal memory cells.

During a "programming phase," each SOT MRAM non-volatile memory cell $S'_{11}, S'_{12}, \ldots, S'_{mn}$ is programmed to store a corresponding weight of an n×m array of weights $w_{11}, w_{12}, w_{13}, \ldots, w_{nm}$, respectively. In particular, each SOT MRAM non-volatile memory cell $S'_{xx}$ is programmed by applying electrical current pulses from first terminal $A_{xx}$ to second terminal $B_{xx}$. Both programming and inferencing run current pulses from first terminal $A_{xx}$ to second terminal $B_{xx}$, but programming runs higher current than inferencing.

During inferencing, SOT MRAM non-volatile memory cells $S'_{11}, S'_{12}, \ldots, S'_{mn}$ of cross-point memory array 400 are operated as described above regarding SOT MRAM non-volatile memory cells $S_{11}, S_{12}, \ldots, S_{mn}$ of cross-point memory array 300. In particular, during the inferencing phase each SOT MRAM non-volatile memory cell $S'_{11}, S'_{12}, \ldots, S'_{mn}$ conducts a memory cell current that corresponds to the result of multiplying one of the elements of the n-element input vector (multiply vector) by the corresponding weight stored in the non-volatile memory cell.

For example, SOT MRAM non-volatile memory cell $S'_{11}$ conducts a memory cell current that corresponds to the product $Vin_1 \times w_{11}$, SOT MRAM non-volatile memory cell $S'_{12}$ conducts a memory cell current that corresponds to the product $Vin_2 \times w_{12}$, SOT MRAM non-volatile memory cell $S'_{23}$ conducts a memory cell current that corresponds to the product $Vin_3 \times w_{23}$, and so on.

During the inferencing phase, the memory cell currents in SOT MRAM non-volatile memory cells $S'_{11}, S'_{12}, \ldots, S'_{mn}$ flow to the bit line BL1, BL2, ..., BLm connected to the memory cell. Bit lines BL1, BL2, ..., BLm conduct bit line currents $Iout_1, Iout_2, \ldots, Iout_m$, respectively. Each bit line current is the summation of the memory cell currents of the memory cells connected to that bit line, described above in connection with equations (8)-(10).

In the examples described above, cross-point memory arrays 300 (FIG. 3A) and 400 (FIG. 4) have been used to implement a single layer of an artificial neural network 200 that includes input neurons $x_1, x_2, x_3, \ldots, x_n$, output neurons $y_1, y_2, y_3, \ldots, y_m$, and synapses 202 that connect input neurons $x_1, x_2, x_3, \ldots, x_n$ to output neurons $y_1, y_2, y_3, \ldots, y_m$. In other embodiments, multi-layer artificial neural networks may be implemented by cascading cross-point memory arrays, so that output of a first cross-point memory array are used as inputs to a second cross-point memory array, and so on.

In addition, in the examples described above, cross-point memory arrays 300 (FIG. 3A) and 400 (FIG. 4) have been described that are configured to implement binary neural networks in which each SOT MRAM non-volatile memory cell in the array stores a binary weight, n binary inputs are applied to the first conductive lines, and m binary outputs are generated at the second conductive lines. Persons of ordinary skill in the art will understand that additional circuitry may be used to perform operations such as shift and add to achieve multiple-bit capabilities for the weight matrix for higher precision.

Without wanting to be bound by any particular theory, it is believed that the cross-point memory arrays described above may achieve fast speed as a result of parallel in-memory computing, without moving data between a processor and memory. In addition, it is believed that the cross-point memory arrays described above may achieve low power consumption due to the non-volatile memory nature of MRAM-like elements. In addition, it is believed that the large Spin Hall Effect of BiSb-based SOT MRAM non-volatile memory elements may result in further lowered power consumption. Moreover. it is believed that the cross-point memory arrays described above are compatible with CMOS processes, making such solutions cost-effective.

One embodiment includes an apparatus including an array including n rows and m columns of nodes, each row of nodes coupled to one of n first conductive lines, each column of nodes coupled to one of m second conductive lines, each node of the n rows and m columns of nodes including a spin orbit torque MRAM non-volatile memory cell configured to store a corresponding weight of an n×m array of weights each having a first weight value or a second weight value, and a control circuit configured to apply n input voltages each having a first input value or a second input value to corresponding n first conductive lines, the n input voltages corresponding to an n-element input vector. The spin orbit torque MRAM non-volatile memory cells are configured to generate m output currents at the m second conductive lines upon application of the n input voltages. The m output currents corresponding to a result of multiplying the input vector by the n×m array of weights.

One embodiment includes an apparatus including a cross-point memory array including a plurality of spin orbit torque MRAM non-volatile memory cells configured to store synaptic weights of an artificial neural network, a plurality of word lines coupled to the spin orbit torque MRAM non-volatile memory cells, and a plurality of bit lines coupled to the spin orbit torque MRAM non-volatile memory cells In response to a plurality of input voltages coupled to the plurality of word lines, the spin orbit torque MRAM non-volatile memory cells generate output currents at the plurality of bit lines representing outputs of the artificial neural network.

One embodiment includes a method including programming each of a plurality of spin orbit torque MRAM non-volatile memory cells with a corresponding weight of an n×m array of weights each having a first weight value or a second weight value, generating n input voltages corresponding to an n-element input vector, and applying the n input voltages to the plurality of spin orbit torque MRAM non-volatile memory cells to generate m output currents that represent a result of multiplying the n-element input vector by the n×m array of weights.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

The invention claimed is:

1. An apparatus comprising:
an array comprising n rows and m columns of nodes, each row of nodes coupled to one of n first conductive lines, each column of nodes coupled to one of m second conductive lines, each node of the n rows and m columns of nodes comprising a spin orbit torque magnetoresistive memory (MRAM) non-volatile memory cell configured to store a corresponding weight of an n×m array of weights each having a first weight value or a second weight value; and
a control circuit configured to apply n input voltages each having a first input value or a second input value to corresponding n first conductive lines, the n input voltages corresponding to an n-element input vector, wherein:
each spin orbit torque MRAM non-volatile memory cell comprises:
a first terminal coupled to one of the n first conductive lines;
a second terminal coupled to one of the m second conductive lines; and
a third terminal coupled to one of n third conductive lines;
the spin orbit torque MRAM non-volatile memory cells are configured to generate m output currents at the m second conductive lines upon application of the n input voltages; and
the m output currents correspond to a result of multiplying the input vector by the n×m array of weights.

2. The apparatus of claim 1, wherein:
each spin orbit torque MRAM non-volatile memory cell further comprises:
a Spin Hall Effect layer; and
a magnetic tunnel junction comprising a pinned layer and a free layer that each have a perpendicular direction of magnetization; and
the magnetic tunnel junction comprises a substantially cylindrical shape.

3. The apparatus of claim 1, wherein:
each spin orbit torque MRAM non-volatile memory cell further comprises:
a Spin Hall Effect layer; and
a magnetic tunnel junction comprising a pinned layer and a free layer that each have an in-plane direction of magnetization;
the magnetic tunnel junction comprises a substantially ellipsoidal shape; and
the pinned layer and the free layer each have an easy axis perpendicular to a current flow in the Spin Hall Effect layer.

4. The apparatus of claim 1, wherein:
each spin orbit torque MRAM non-volatile memory cell further comprises:
a Spin Hall Effect layer; and
a magnetic tunnel junction comprising a pinned layer and a free layer that each have an in-plane direction of magnetization;
the magnetic tunnel junction comprises a substantially ellipsoidal shape; and
the pinned layer and the free layer each have an easy axis that is at an angle off-perpendicular to a current flow in the Spin Hall Effect layer.

5. The apparatus of claim 1, wherein:
each spin orbit torque MRAM non-volatile memory cell further comprises:
a Spin Hall Effect layer; and
a magnetic tunnel junction comprising a free layer; and
each spin orbit torque MRAM non-volatile memory cell is configured to be programmed by:
applying a first electrical current pulse through the Spin Hall Effect layer to cause a direction of magnetization of the free layer to oscillate; and
applying a second electrical pulse through the magnetic tunnel junction and the Spin Hall Effect layer to switch the direction of magnetization of the free layer.

6. The apparatus of claim 1, wherein each spin orbit torque MRAM non-volatile memory cell further comprises a Spin Hall Effect layer comprising any of a heavy metal and a topological insulator.

7. The apparatus of claim 1, wherein each spin orbit torque MRAM non-volatile memory cell further comprises a Spin Hall Effect layer comprising bismuth antimony with (012) orientation.

8. The apparatus of claim 1, wherein:
the n input voltages correspond to elements of an input vector; and
each spin orbit torque MRAM non-volatile memory cell is configured to conduct a memory cell current that corresponds to a result of multiplying one of the elements of the input vector by the corresponding weight stored in the spin orbit torque MRAM non-volatile memory cell.

9. The apparatus of claim 1, wherein:
the n input voltages correspond to elements of an input vector; and each of the m output currents corresponds to a sum of products of the input vector with corresponding weights in a column of the n×m array of weights.

10. An apparatus comprising:
a cross-point memory array comprising a plurality of spin orbit torque magnetoresistive memory (MRAM) non-volatile memory cells configured to store synaptic weights of an artificial neural network;
a plurality of word lines coupled to the spin orbit torque MRAM non-volatile memory cells; and
a plurality of bit lines coupled to the spin orbit torque MRAM non-volatile memory cells, wherein:
each spin orbit torque MRAM non-volatile memory cell comprises a Spin Hall Effect layer comprising a topological insulator; and
in response to a plurality of input voltages coupled to the plurality of word lines, the spin orbit torque MRAM non-volatile memory cells are configured to generate output currents at the plurality of bit lines representing outputs of the artificial neural network.

11. The apparatus of claim 10, wherein each spin orbit torque MRAM non-volatile memory cell further comprises:
a first terminal coupled to one word line of the plurality of word lines; and
a second terminal coupled to one bit line of the plurality of bit lines.

12. The apparatus of claim 10, wherein:
each spin orbit torque MRAM non-volatile memory cell further comprises a magnetic tunnel junction comprising a free layer; and
each spin orbit torque MRAM non-volatile memory cell is configured to be programmed by:
applying a first electrical current pulse through the Spin Hall Effect layer to cause a direction of magnetization of the free layer to oscillate; and
applying a second electrical pulse through the magnetic tunnel junction and the Spin Hall Effect layer to switch the direction of magnetization of the free layer.

13. The apparatus of claim 10, wherein:
each spin orbit torque MRAM non-volatile memory cell further comprises a magnetic tunnel junction comprising a free layer; and
each spin orbit torque MRAM non-volatile memory cell is configured to be programmed by applying an electrical current pulse through the Spin Hall Effect layer to switch a direction of magnetization of the free layer.

14. The apparatus of claim 10, wherein each bit line of the plurality of bit lines is input to an activation function of the artificial neural network.

15. The apparatus of claim 10, wherein the topological insulator is bismuth antimony with (012) orientation.

16. A method comprising:
programming each cell of a plurality of spin orbit torque magnetoresistive memory (MRAM) non-volatile memory cells with a corresponding weight of an n×m array of weights, each cell having a first weight value or a second weight value, wherein:
each spin orbit torque MRAM non-volatile memory cell comprises:
a Spin Hall Effect layer; and
a magnetic tunnel junction comprising a free layer; and
each spin orbit torque MRAM non-volatile memory cell is configured to be programmed by:
applying a first electrical current pulse through the Spin Hall Effect layer to cause a direction of magnetization of the free layer to oscillate; and
applying a second electrical pulse through the magnetic tunnel junction and the Spin Hall Effect layer to switch the direction of magnetization of the free layer;
generating n input voltages corresponding to an n-element input vector; and
applying the n input voltages to the plurality of spin orbit torque MRAM non-volatile memory cells to generate m output currents that represent a result of multiplying the n-element input vector by the n×m array of weights.

17. The method of claim 16, wherein the Spin Hall Effect layer comprises a topological insulator.

18. The method of claim 16, further comprising, in response to a plurality of input voltages coupled to a plurality of word lines coupled to the spin orbit torque MRAM non-volatile memory cells:
generating, by the spin orbit torque MRAM non-volatile memory cells, output currents at a plurality of bit lines coupled to the spin orbit torque MRAM non-volatile memory cells and representing outputs of an artificial neural network, wherein the plurality of spin orbit torque MRAM non-volatile memory cells are configured to store synaptic weights of the artificial neural network.

19. The apparatus of claim 1, wherein each spin orbit torque MRAM non-volatile memory cell further comprises a Spin Hall Effect layer comprising a topological insulator.

20. The apparatus of claim 1, further comprising means for training the n×m array of weights to generate the m output currents representing outputs of an artificial neural network.

* * * * *